United States Patent
Ninomiya et al.

(10) Patent No.: US 8,530,321 B2
(45) Date of Patent: Sep. 10, 2013

(54) VARIABLE RESISTANCE ELEMENT AND MANUFACTURING METHOD THEREOF

(75) Inventors: Takeki Ninomiya, Osaka (JP); Yoshio Kawashima, Osaka (JP); Yukio Hayakawa, Kyoto (JP); Takumi Mikawa, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/515,761

(22) PCT Filed: Dec. 14, 2010

(86) PCT No.: PCT/JP2010/007250
§ 371 (c)(1),
(2), (4) Date: Jun. 13, 2012

(87) PCT Pub. No.: WO2011/074243
PCT Pub. Date: Jun. 23, 2011

(65) Prior Publication Data
US 2012/0252184 A1    Oct. 4, 2012

(30) Foreign Application Priority Data
Dec. 18, 2009    (JP) .................................. 2009-287685

(51) Int. Cl.
*H01L 21/20*    (2006.01)
(52) U.S. Cl.
USPC .......................................... 438/384; 438/382
(58) Field of Classification Search
USPC .................................................. 438/382, 384
See application file for complete search history.

(56) References Cited

U.S. PATENT DOCUMENTS

| 2005/0167699 | A1  | 8/2005  | Sugita et al. |
| 2007/0240995 | A1  | 10/2007 | Odagawa et al. |
| 2009/0257271 | A1  | 10/2009 | Noshiro |
| 2009/0283736 | A1* | 11/2009 | Kanzawa et al. .................. 257/2 |
| 2009/0302362 | A1* | 12/2009 | Kikuchi et al. ............... 257/295 |
| 2009/0321711 | A1  | 12/2009 | Takagi et al. |
| 2011/0294259 | A1  | 12/2011 | Kanzawa et al. |

FOREIGN PATENT DOCUMENTS

| EP | 1 073 109 A2 | 1/2001 |
| JP | 2005-340418 | 12/2005 |
| JP | 2009-146943 | 7/2009 |
| WO | WO 2008/117371 A1 | 10/2008 |

OTHER PUBLICATIONS

International Search Report issued in International Patent Application No. PCT/JP2010/007250, mailed Mar. 22, 2011.

* cited by examiner

*Primary Examiner* — Seahvosh Nikmanesh
*Assistant Examiner* — Brigitte Paterson
(74) *Attorney, Agent, or Firm* — McDermott Will & Emery LLP

(57) ABSTRACT

A variable resistance element comprises, when M is a transition metal element, O is oxygen, and x and y are positive numbers satisfying y>x; a lower electrode; a first oxide layer formed on the lower electrode and comprising $MO_x$ when a content ratio of O with respect to M is x; a second oxide layer formed on the first oxide layer and comprising $MO_y$ when a content ratio of O with respect to M is y; an upper electrode formed on the second oxide layer; a protective layer formed on the upper electrode and comprising an electrically conductive material having a composition different from a composition of the upper electrode; an interlayer insulating layer formed to cover the protective layer; and an upper contact plug formed inside an upper contact hole penetrating the interlayer insulating layer.

11 Claims, 17 Drawing Sheets ent and is connected to the lower wire 101. A lower electrode 104, a first oxide layer 105x, a second oxide layer 105y, and an upper electrode 106 are stacked in this order on the first interlayer insulating layer 102 such that they cover the lower contact plug 103, and an oxide layer 105 including the first oxide layer 105x and the second oxide layer 105y is sandwiched between the upper and lower electrodes. A second interlayer insulating layer 107 is formed to cover the upper electrode 106. An upper contact plug 108 penetrates the second interlayer insulating layer 107 and is connected to the upper electrode 106. An upper wire 109 is formed to cover the upper contact plug 108 exposed on the upper surface of the second interlayer insulating layer 107. The variable resistance element 20 is identical to that manufactured as Comparative example as described later.

VARIABLE RESISTANCE ELEMENT AND MANUFACTURING METHOD THEREOF

RELATED APPLICATIONS

This application is the U.S. National Phase under 35 U.S.C. §371 of International Application No. PCT/JP2010/007250, filed on Dec. 14, 2010, which in turn claims the benefit of Japanese Application No. 2009-287685, filed on Dec. 18, 2009, the disclosures of which Applications are incorporated by reference herein.

TECHNICAL FIELD

The present invention relates to a variable resistance non-volatile memory element (variable resistance element: ReRAM element), resistance values of which change by application of voltage pulses.

BACKGROUND ART

In recent years, with a progress of digital technologies, electronic devices such as portable information devices and information home appliances have been developed to provide higher functionalities. With achievement of higher functionalities of the electronic devices, semiconductor elements incorporated into the electronic devices have been developed at a higher pace to provide further miniaturization and higher speeds of them. Among them, the application of a non-volatile memory having a great capacity, which is represented by a flash memory, has been expanding at a higher pace. Moreover, as a novel non-volatile memory in next generation, which has a potential of replacing the flash memory, a variable resistance non-volatile memory device including a variable resistance element (variable resistance non-volatile memory element whose resistance values change by application of voltage pulses: ReRAM element) has been studied and developed. As defined herein, the variable resistance element refers to as an element having a characteristic in which its resistance values reversibly change in response to electric signals and being capable of storing information corresponding to the resistance values in a non-volatile manner.

Patent Literature 1 discloses a variable resistance element including a variable resistance layer having a stacked-layer structure in which transition metal oxide layers which are different in oxygen content are stacked together. In this variable resistance element, a redox reaction can take place selectively in a region of the interface between a variable resistance layer with a higher oxygen content and an electrode by alternately applying voltages with different polarities. Thus, a resistance changing phenomenon can take place stably.

Patent Literature 2 discloses a resistance memory element which includes a lower electrode, a resistance memory layer 14 formed on the lower electrode, and an upper electrode formed on the resistance memory layer, stores a high-resistance state and a low-resistance state, and switches its resistance state between the high-resistance state and the low-resistance state by application of voltages, the lower electrode or the upper electrode having a first conductive layer provided at the resistance memory layer side and comprising precious metal, and a second conductive layer being in contact with the first conductive layer, being thicker than the first conductive layer, and comprising non-precious metal.

CITATION LISTS

Patent Literatures

Patent Literature 1: International Publication No. 2008/149484

Patent Literature 2: International Publication No. 2008/117371

SUMMARY OF THE INVENTION

Technical Problem

However, a conventional variable resistance element has a problem in which there is significant non-uniformity of characteristics among elements, even if they are manufactured using substantially the same conditions. Especially, there is significant non-uniformity of characteristics among elements within the same wafer which are assumed as manufactured using substantially the same conditions. Thus, there exists a problem.

The present invention has been developed to solve the above mentioned problems, and an object of the present invention is to provide a variable resistance element which can lessen non-uniformity of characteristics among elements.

Solution to Problem

The present inventors studied carefully to solve the above mentioned problems, and discovered the following.

FIG. 11 is a view of a schematic configuration of a variable resistance element manufactured in the middle of development of the present invention, showing Comparative example (its detail will be described later) of the variable resistance element of the present invention. In a variable resistance element 20, a lower wire 101 is formed on a substrate 100 and a first interlayer insulating layer 102 is formed to cover the lower wire 101. A lower contact plug 103 penetrates the first interlayer insulating layer 102 and is connected to the lower wire 101. A lower electrode 104, a first oxide layer 105x, a second oxide layer 105y, and an upper electrode 106 are stacked in this order on the first interlayer insulating layer 102 such that they cover the lower contact plug 103, and an oxide layer 105 including the first oxide layer 105x and the second oxide layer 105y is sandwiched between the upper and lower electrodes. A second interlayer insulating layer 107 is formed to cover the upper electrode 106. An upper contact plug 108 penetrates the second interlayer insulating layer 107 and is connected to the upper electrode 106. An upper wire 109 is formed to cover the upper contact plug 108 exposed on the upper surface of the second interlayer insulating layer 107. The variable resistance element 20 is identical to that manufactured as Comparative example as described later.

In such a structure, when a voltage is applied between the upper electrode 106 and the lower electrode 104 of the variable resistance element 20, a greater portion of the voltage is applied to the second oxide layer 105y being higher in oxygen content and exhibiting a higher resistance value. There are plenty of oxygen ions which can be used for a reaction in the vicinity of an interface between the second oxide layer 105y and the upper electrode 106. Therefore, in a region of the interface between the second oxide layer 105y and the upper electrode 106, a redox reaction of the second oxide layer 105y can take place selectively, and a resistance changing operation (phenomenon in which resistance values between electrodes change by application of electric pulses between the electrodes) can take place stably.

However, in the variable resistance element configured as described above, significant non-uniformity of characteristics among elements was observed even when they were manufactured using substantially the same conditions (see description of Comparative example as described later and FIG. 13B). There was significant non-uniformity of characteristics among elements within the same wafer which were assumed as manufactured using substantially the same conditions.

FIGS. 12A and 12B are views showing the cross-section of major constituents of the above stated variable resistance element. FIG. 12A is a transmission electron micrograph, and FIG. 12B is a trace diagram of the transmission electron micrograph of FIG. 12A. Reference symbols in FIG. 12B are identical to those of FIG. 11, and will not be described. As shown in FIGS. 12A and 12B, in the variable resistance element 20, a plurality of hillocks 106$x$ were formed to protrude from the upper electrode 106 into the second oxide layer 105$y$. It appeared that the hillocks 106$x$ extended from grain boundaries (boundaries indicated by a broken line in FIG. 12) of platinum constituting the upper electrode 106, at an interface between the upper electrode 106 and the second oxide layer 105$y$. By comparison, when a heating step (heating step performed in a wiring step after formation of the upper electrode) was omitted from manufacturing process steps, the hillocks did not emerge. From this fact, it was estimated that the hillocks 106$x$ were formed because of an event in which the temperature of the upper electrode was elevated in the heating step. In other words, it was estimated that formation of the hillocks 106$x$ was primarily attributed to a stress generated by thermal expansion of the upper electrode 106. When the upper electrode 106 was thermally expanded, the stress was generated. The stress was mitigated most easily by formation of the hillocks 106$x$ along the grain boundaries of the upper electrode 106 (see recitation of Comparative example as described later).

The hillocks 106$x$ have a drawback that they cause non-uniformity of characteristics among elements, but has an advantage that they can decrease a voltage required to perform initial breakdown (see Experimental example 3). If the hillocks 106$x$ can be formed uniformly, to be precise, a formation amount of the hillocks 106$x$ can be controlled properly, it is possible to lessen non-uniformity of characteristics among elements while decreasing the voltage required to perform the initial breakdown.

It is supposed that the hillocks are formed by the above stated mechanism. This means that the hillocks originate from a material of the upper electrode. It is presumed that the formation amount of the hillocks varies depending on the volume of the upper electrode per unit area, to be precise, the thickness of the upper electrode. In the variable resistance element 20, the upper electrode 108 is directly in contact with the upper electrode 106. To form the upper contact plug 108, it is necessary to form a contact hole such that it reaches the upper electrode 106. In this case, to enable the upper contact plug 108 to be surely connected to the upper electrode 106, it is necessary to cause the contact hole to surely reach the upper surface of the upper electrode 106. In this case, the upper electrode 106 might be eroded due to over-etching or the like, or a material of the upper contact plug 108 and the upper electrode 106 might react each other. Thus, a substantial thickness (thickness which determines formation amount of the hillocks) of the upper electrode 106 is affected significantly by intensity of the etching (see Experimental example 2). It is presumed that non-uniformity of thicknesses of upper electrodes 106 causes non-uniformity of formation amounts of the hillocks, and hence non-uniformity of characteristics among elements.

The present inventors presumed that the above stated non-uniformity could be lessened effectively by placing a protective layer comprising an electrically conductive material having a composition different from that of the upper electrode, between the upper electrode and the contact plug. It was confirmed that non-uniformity among elements could be lessened, when the variable resistance element was manufactured by placing the protective layer actually (see Example 1 and FIG. 13A).

To solve the above mentioned problem, a variable resistance element of the present invention comprises, when M is a transition metal element and O is oxygen; a lower electrode; a first oxide layer formed on the lower electrode and comprising MO$_x$ when a content ratio of O with respect to M is x; a second oxide layer formed on the first oxide layer and comprising MO$_y$ when a content ratio of O with respect to M is y; an upper electrode formed on the second oxide layer; a protective layer formed on the upper electrode and comprising an electrically conductive material having a composition different from a composition of the upper electrode; an interlayer insulating layer formed to cover the protective layer; and an upper contact plug formed inside an upper contact hole penetrating the interlayer insulating layer; the upper electrode having a plurality of hillocks which protrude into the second oxide layer and do not pierce the second oxide layer; and the upper contact plug being configured not to physically contact the upper electrode and physically contact the protective layer such that the upper contact plug is electrically connected to the upper electrode.

In such configuration, it is possible to lessen non-uniformity of characteristics among elements.

In the variable resistance element, the second oxide layer may have a plurality of locally thinned portions.

In the variable resistance element, the second oxide layer may have a plurality of concave portions to have the plurality of locally thinned portions at an interface between the second oxide layer and the upper electrode.

In the variable resistance element, the concave portions may be formed along grain boundaries of a material constituting the upper electrode.

In the variable resistance element, an interface between the first oxide layer and the second oxide layer may be flat, but an interface between the second oxide layer and the upper electrode may have concave and convex portions, to cause the second oxide layer to have the plurality of locally thinned portions.

In the variable resistance element, the upper electrode may have hillocks at an interface between the second oxide layer and the upper electrode, to cause the second oxide layer to have the plurality of locally thinned portions.

In the variable resistance element, the transition metal element may be tantalum and $2.1 \leq y$ and $0.8 \leq x \leq 1.9$ may be satisfied.

In the variable resistance element, the upper electrode may have a thickness which is greater than 10 nm and less than 100 nm.

In the variable resistance element, the upper electrode may have a thickness which is greater than 20 nm and less than 100 nm.

In the variable resistance element, the upper electrode may comprise one of platinum, palladium, alloy containing platinum, and alloy containing palladium.

In the variable resistance element, the hillocks may be configured not to physically contact the first oxide layer.

In the variable resistance element, the protective layer may comprise a nitride of alloy of titanium and aluminum or a nitride of titanium.

A method of manufacturing a variable resistance element, of the present invention, comprises: when M is a transition metal element and O is oxygen; forming a lower electrode material layer; forming on the lower electrode material layer, a first oxide material layer comprising MO when a content ratio of O with respect to M is x (x: positive number), and a second oxide layer comprising $MO_y$ when a content ratio of O with respect to M is y (y>x), in this order; forming an upper electrode material layer on the second oxide material layer; forming a protective material layer on the upper electrode material layer, the protective material layer having a composition different from a composition of the upper electrode; patterning the lower electrode material layer, the first oxide material layer, the second oxide material layer, the upper electrode material layer, and the protective material layer in a predetermined shape to form a lower electrode, a first oxide layer, a second oxide layer, an upper electrode, and a protective layer, respectively; forming an interlayer insulating layer such that the interlayer insulating layer covers the protective layer; forming an upper contact hole such that the upper contact hole penetrates the interlayer insulating layer, the protective layer is exposed on a bottom of the upper contact hole, and the upper electrode is not exposed on the bottom of the upper contact hole; forming an upper contact plug inside the upper contact hole; and heating the upper electrode to form a plurality of hillocks which protrude into the second oxide layer and do not pierce the second oxide layer.

The above and further objects, features and advantages of the present invention will more fully be apparent from the following detailed description of preferred embodiments with reference to accompanying drawings.

Advantageous Effects of the Invention

The present invention has the above described configuration, and has an advantage that there can be provided a variable resistance element which can lessen non-uniformity of characteristics among elements.

BRIEF DESCRIPTION OF DRAWINGS

FIGS. 2A to 2F are cross-sectional views showing process steps of a manufacturing method of the variable resistance element according to Embodiment 1 of the present invention, in which FIG. 2A is a view showing the step of forming a lower electrode material layer, FIG. 2B is a view showing the step of forming an oxide material layer, FIG. 2C is a view showing the step of forming a second oxide material layer, FIG. 2D is a view showing the step of forming an upper electrode material layer and a protective material layer, FIG. 2E is a view showing the step of etching the protective material layer, and FIG. 2F is a view showing the step of etching the lower electrode material layer, the first oxide material layer, the second oxide material layer and the upper electrode material layer.

FIG. 3B is a view showing the step of forming an upper contact hole in the second interlayer insulating layer, FIG. 3C is a view showing the step of forming an upper contact plug inside the upper contact hole, and FIG. 3D is a view showing the step of forming an upper wire.

FIGS. 4A and 4B are views showing the cross-section of major constituents of the variable resistance element according to Example 1, in which FIG. 4A is a transmission electron micrograph, and FIG. 4B is a trace diagram of the transmission electron micrograph of FIG. 4A.

FIGS. 5A and 5B are enlarged views of an interface between an upper electrode and a second oxide layer in the variable resistance element according to Example 1, in which FIG. 5A is a transmission electron micrograph, and FIG. 5B is a trace diagram of the transmission electron micrograph of FIG. 5A.

FIGS. 10A and 10B are views showing the cross-section of the variable resistance element in which the thickness of the upper electrode is set to 8 nm in Experimental example 1, in which FIG. 10A is a transmission electron micrograph, and FIG. 10B is a trace diagram of the transmission electron micrograph of FIG. 10A.

FIGS. 12A and 12B are views showing the cross-section of major constituents of the variable resistance element according to Comparative example, in which FIG. 12A is a transmission electron micrograph, and FIG. 12B is a trace diagram of the transmission electron micrograph of FIG. 12A.

FIGS. 13A and 13B are views showing non-uniformity of characteristics among elements in Example 1 and non-uniformity of characteristics among elements in Comparative example, respectively, which are for the purpose of comparison, in which FIG. 13A is a view showing non-uniformity of characteristics among elements, in the relation between the thickness of the second oxide layer and the initial resistance in Example 1 of the present invention, and 13B is a view showing non-uniformity of characteristics among elements, in the relation between the thickness of the second oxide layer and the initial resistance in Comparative example.

FIGS. 14A and 14B are views showing the relation between the area of the variable resistance element and the initial resistance of the variable resistance element in Example 1 and the relation between the area of the variable resistance element and the initial resistance of the variable resistance element in Comparative example, in which FIG. 14A shows the relation in Example 1 of the present invention, and FIG. 14B shows the relation in Comparative example.

FIGS. 15A and 15B are views showing the cross-section of a variable resistance element according to Experimental example 2, in which FIG. 15A is a scanning electron micrograph, and FIG. 15B is a trace diagram of the scanning electron micrograph of FIG. 15A.

FIGS. 17A and 17B are views showing the cross-section of a variable resistance element according to Experimental example 3 (upper electrode is Ir), in which FIG. 17A is a transmission electron micrograph, and FIG. 17B is a trace diagram of the transmission electron micrograph of FIG. 17A.

DESCRIPTION OF THE EMBODIMENTS

Hereinafter, embodiments of the present invention will be described with reference to the drawings.

Embodiment 1

Configuration of Element

Figure 1:
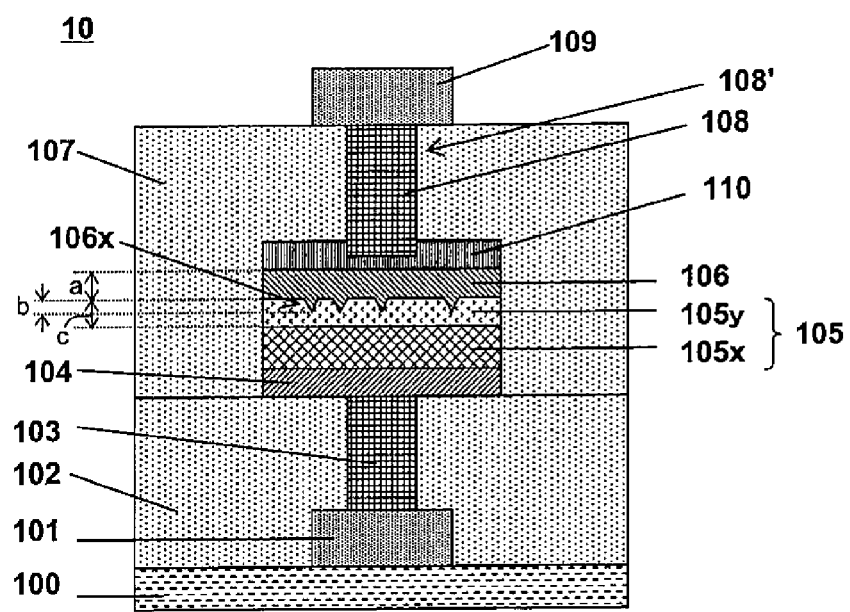
FIG. 1 is a cross-sectional view showing a schematic configuration of a variable resistance element according to Embodiment 1 of the present invention.

FIG. 1 is a cross-sectional view showing a schematic configuration of a variable resistance element according to Embodiment 1 of the present invention. As shown in FIG. 1, a variable resistance element 10 according to Embodiment 1 includes, when M is a particular transition metal element and O is oxygen, a lower electrode 104, a first oxide layer 105x formed on the lower electrode 104 and comprising $MO_x$ when a content ratio of O with respect to M is x (x: positive number), a second oxide layer 105y formed on the first oxide layer 105x and comprising $MO_y$, when a content ratio of O with respect to M is y (y>x), an upper electrode 106 formed on the second oxide layer 105y, a protective layer 110 formed on the upper electrode 106 and comprising an electrically conductive material having a composition different from that of the upper electrode 106, an interlayer insulating layer (second interlayer insulating layer 107) formed to cover the protective layer 110, and an upper contact plug 108 formed inside an upper contact hole 108' penetrating the second interlayer insulating layer 107, wherein the upper electrode 106 has a plurality of hillocks which protrude into the second oxide layer 105y and do not pierce the second oxide layer 105y, and the upper contact plug 108 is not physically in contact with the upper electrode 106 but is physically in contact with the protective layer 110 such that that the upper contact plug 108 is electrically connected to the upper electrode 106.

In such a configuration, upper electrodes 106 can be set to have a constant thickness, and non-uniformity of characteristics among elements can be lessened.

The variable resistance element 10 may be a unipolar variable resistance element (variable resistance element which reversibly changes from a high-resistance state to a low-resistance state by applying a first electric pulse having a first polarity, and reversibly changes from the low-resistance state to the high-resistance state by applying a second electric pulse having the first polarity and being different in voltage from the first electric pulse), or a bipolar variable resistance element (variable resistance element which reversibly changes from a high-resistance state to a low-resistance state by applying a first electric pulse having a first polarity, and reversibly changes from the low-resistance state to the high-resistance state by applying a second electric pulse having a second polarity different from the first polarity). Nonetheless, the variable resistance element 10 is preferably the bipolar variable resistance element.

When the variable resistance element 10 is the bipolar variable resistance element, it changes from the high-resistance state to the low-resistance state (attains the low-resistance state) by applying to the upper electrode 106, a negative voltage pulse having an amplitude equal to or greater than a first threshold voltage, on the basis of the lower electrode 104, while it changes from the low-resistance state to the high-resistance state (attains the high-resistance state) by applying to the upper electrode 106, a positive voltage pulse having an amplitude equal to or greater than a second threshold voltage, on the basis of the lower electrode 104. It is presumed that a phenomenon in which the variable resistance element 10 attains the low-resistance state occurs in such a manner that oxygen ions present in the second oxide layer 105y are expelled from the second oxide layer 105y and migrate to the first oxide layer 105x in response to the negative voltage pulse having an amplitude equal to or greater than the first threshold voltage, which is applied to the upper electrode 106, and thereby an oxygen content in at least a portion of the second oxide layer 105y is lowered. It is also presumed that a phenomenon in which the variable resistance element 10 attains the high-resistance state occurs in such a manner that the oxygen ions are drawn from the first oxide layer 105x to the second oxide layer 105y, in response to the positive voltage pulse having an amplitude equal to or greater than the second threshold voltage, which is applied to the upper electrode 106, and an oxygen content in the second oxide layer 105y is increased.

When the variable resistance element 10 is the unipolar variable resistance element, it changes from the low-resistance state to the high-resistance state (attains the high-resistance state) by applying to the upper electrode 106, a positive or negative voltage pulse having an amplitude equal to or greater than a first threshold voltage, on the basis of the lower electrode 104, while it changes from the high-resistance state to the low-resistance state (attains the low-resistance state) by applying to the upper electrode 106, a positive or negative voltage pulse having an amplitude equal to or greater than a second threshold voltage (>first threshold voltage), on the basis of the lower electrode 104. The unipolar variable resistance element is different from the bipolar variable resistance element in that the unipolar variable resistance element attains the high-resistance state and the low-resistance state using voltage pulses with the same polarity. Typically, a pulse width in the case where the high-resistance state is attained is greater than a pulse width in the case where the low-resistance state is attained. It is presumed that in the unipolar variable resistance element, thermal oxidation occurs in the second oxide layer 105y by a long pulse and the variable resistance element attains the high-resistance state, while initial breakdown occurs in at least a portion of the second oxide layer 105y in the high-resistance state using a high-voltage pulse, and the variable resistance element attains the low-resistance state. When the variable resistance element 10 is the unipolar variable resistance element, the oxide layer may be composed of a single layer.

By setting the oxygen content of the second oxide layer 105y higher than the oxygen content of the first oxide layer 105x, the resistivity of the second oxide layer 105y is rendered higher than the resistivity of the first oxide layer 105x. This makes it possible to apply an adequate voltage to the variable resistance element, and change its resistance state more surely.

The upper electrode 106 preferably has a plurality of hillocks 106x protruding into second oxide layer 105y. In such a configuration, the initial breakdown voltage of the element can be lowered.

The second oxide layer 105y preferably has a plurality of locally thinned portions. The thinned portions of the second oxide layer 105y correspond to the hillocks 106x of the upper electrode 106, respectively. In such a configuration, the initial breakdown voltage of the element can be lowered.

The second oxide layer 105y may have a plurality of concave portions to have a plurality of locally thinned portions in a region of the interface between the second oxide layer 105y and the upper electrode 106. The concave portions correspond to the hillocks 106x of the upper electrode 106, respectively. In such a configuration, the initial breakdown voltage of the element can be lowered.

The concave portions may be formed along grain boundaries of the material constituting the upper electrode 106. In such a configuration, the initial breakdown voltage of the element can be lowered.

An interface between the first oxide layer 105x and the second oxide layer 105y may be flat, but an interface between the second oxide layer 105y and the upper electrode 106 may have concave and convex portions, to allow the second oxide layer 105y to have a plurality of locally thinned portions. In such a configuration, the initial breakdown voltage of the element can be lowered.

The upper electrode 106 may have the hillocks 106x at the interface between the second oxide layer 105y and the upper electrode 106 to allow the second oxide layer 105y to have a plurality of locally thinned portions. In such a configuration, the initial breakdown voltage of the element can be lowered.

The upper electrode 106 has a thickness a which is greater than 10 nm and less than 100 nm. In such a configuration, the hillocks 106x can be grown on the upper electrode 106 by thermally treating the variable resistance element or the upper electrode. This makes it possible to lower the initial breakdown voltage of the element.

The thickness a of the upper electrode 106 is preferably greater than 20 nm and less than 100 nm. In such a configuration, the initial breakdown voltage in a case where the variable resistance element or the upper electrode is thermally treated is substantially constant, and non-uniformity of characteristics among elements can be lessened more efficiently.

The upper electrode 106 preferably comprises platinum (Pt), palladium (Pd), alloy (Pt alloy) containing platinum, or alloy (Pd alloy) containing palladium. In such a configuration, the hillocks can be formed more surely, and a voltage required to enable initial breakdown to occur can be lowered to 2.0V or less.

Preferably, a length b of the hillocks 106x, which length is substantially perpendicular to a main surface of the substrate, is less than a thickness c of the second oxide layer 105y. Preferably, the hillocks 106x are physically not in contact with the first oxide layer 105x. In such a configuration, it is possible to prevent the upper electrode 106 and the first oxide layer 105x from getting short-circuited and the characteristic of the variable resistance element can be improved. The second oxide layer 105y is higher in oxygen content than the first oxide layer 105x. Therefore, the second oxide layer 105y is allowed to have a higher-resistance than the first oxide layer 105x. By placing the second oxide layer 105y between the hillocks 106x and the first oxide layer 105x to prevent a physical contact between the hillocks 106x and the first oxide layer 105x, an adequate voltage can be applied to the variable resistance element 10, and a resistance changing operation can take place more surely.

The protective layer 110 is preferably placed between the upper contact plug 108 and the upper electrode 106 to prevent a physical contact between the upper contact plug 108 and the upper electrode 106. In such a configuration, non-uniformity of characteristics among elements can be suppressed more surely.

In the case of the bipolar variable resistance element, it is preferable that the transition metal element M is tantalum (Ta), and $2.1 \leq y$ and $0.8 \leq x \leq 1.9$ are satisfied. In such a configuration, it is possible to provide a variable resistance element which can implement higher-speed operability, and has a rewrite characteristic which is reversible and stable and a good retention characteristic.

More preferably, $y \geq 2.5$ is satisfied. By setting the oxygen content of the second oxide layer 105y higher, a leak current in a state where the variable resistance element is in a high-resistance state can be suppressed, and a read margin can be increased. As a result, a greater memory array can be constructed and higher-dense integration can be implemented.

The protective layer 110 serves as a material which is lower in etching rate than an insulating material constituting the second interlayer insulating layer 107, i.e., a material serving as an etch stop layer, when the upper contact hole 108' is formed.

The protective layer 110 preferably comprises a nitride (TiAlN) of alloy of titanium and aluminum or a nitride (TiN) of titanium. In such a configuration, the protective layer 110 comprises an electrically conductive material and serves as an effective etch stop layer, to more effectively suppress the upper electrode 106 from getting eroded due to over-etching. In a case where the upper electrode 106 comprises a material which is low in adhesiveness to the interlayer insulating layer, such as platinum, the protective layer 110 serves as an adhesion layer, and a structure of the element is made stable. The protective layer 110 can also be used as a hard mask when the lower electrode 104, the first oxide layer 105x, the second oxide layer 105y, and the upper electrode 106 are processed to have desired dimensions (element area). In typical cases, the hard mask comprising the nitride of alloy of titanium and aluminum or the nitride of titanium, has a relatively higher resistance, and is etched away completely. However, the hard mask is left to serve as the protective layer.

The protective layer 110 comprises an electrically conductive material having a composition different from that of the upper electrode 106. The term "different composition" means that an element constituting a material is different, and does not mean that a ratio (content) of an element is different. The protective layer 110 preferably does not contain a major component of the upper electrode 106. This makes it possible to prevent the thickness of the protective layer 110 from affecting the formation amount of the hillocks.

The upper electrode 106 may be heated. By the heating process step, the hillocks 106x can be formed simply and efficiently.

In a general wiring step (performed after the step of forming the upper electrode of the variable resistance element), the variable resistance element is in some cases heated. In such cases, the hillocks can be formed suitably by placing the protective layer without performing the heating process step intentionally. The heating process step may be heating performed intentionally to form the hillocks, or heating resulting from a temperature increase caused by another process step.

Projections of the "hillocks" need not be pointed. Instead, the "projections" may have a gently swelling shape. In a case where there are a plurality of "projections," any of these "projections" preferably does not pierce the second oxide layer 105y.

The lower electrode 104 comprises, for example, a tantalum nitride (TaN), and may have a thickness of, for example, 20 nm.

The first oxide layer 105x preferably comprises an oxygen-deficient transition metal oxide (transition metal oxide which is deficient in oxygen content in terms of a stoichiometric composition). The transition metal M is not limited to tantalum, but may be hafnium (Hf), zirconium (Zr), iron (Fe), or other transition metal. A composition is expressed as x:y when, for example, a composition of a binary material is $A_xB_y$, and is a mole ratio (atom ratio). The first oxide layer 105x may have a thickness of 20 nm to 200 nm, and the second oxide layer 105y may have a thickness of 1 nm to 10 nm.

The thickness of the upper electrode 106 is defined as a thickness of a portion of the upper electrode 106 where there are no hillocks.

The protective layer 110 may have a thickness of, for example, 50 nm.

The second interlayer insulating layer 107 comprises, for example, silicon dioxide (SiO$_2$). The upper contact plug 108 comprises, for example, titanium/titanium nitride (Ti/TiN) as adhesion layer/barrier layer, and tungsten (W) as a filling layer. The "adhesion layer/barrier layer" are defined as a layer composed of two layers, which are, for example, an outermost "adhesion layer" comprising titanium, and a "barrier layer" located inwardly relative to the "adhesion layer" and comprising a titanium nitride (the same occurs hereinafter). Inwardly relative to the barrier layer, the filling layer comprising, for example, tungsten, is formed.

In the example shown in FIG. 1, the lower wire 101 comprising, for example, aluminum (Al) or copper (Cu) is formed on a substrate 100 comprising, for example, a single-crystal silicon. The first interlayer insulating layer 102 comprising silicon dioxide (SiO$_2$) is formed to cover the lower wire 101. A lower contact hole is formed in the first interlayer insulating layer 102, and the lower contact plug 103 comprising, for example, tungsten, is formed inside the lower contact hole. The first interlayer insulating layer 102 and the lower contact plug 103 are planarized such that their upper end surfaces are coplanar with each other. The above stated variable resistance element 10 is formed such that the lower electrode 104 covers the upper end surface of the lower contact plug 103. The second interlayer insulating layer 107 and the upper contact plug 108 are planarized such that their upper end surfaces are coplanar with each other. The upper wire 109 comprising, for example, aluminum or copper, is formed to cover the upper end surface of the upper contact plug 108.

In the example shown in FIG. 1, the upper contact plug 108 is physically in contact with the protective layer 110, but is not physically in contact with the upper electrode 106. The upper electrode 106 and the hillocks 106$x$ are physically in contact with the second oxide layer 105$y$ but are not physically in contact with the first oxide layer 105$x$.

In the variable resistance element 10, resistance values between the lower electrode 104 and the upper electrode 106 change by application of electric pulses between the lower electrode 104 and the upper electrode 106. By corresponding changes in the resistance values to data (e.g., "1" and "0"), information can be stored. That is, the oxide layer 105 sandwiched between the lower electrode 104 and the upper electrode 106 operates as a memory portion.

In a case where hafnium is used as the transition metal element M in the bipolar variable resistance element, it is preferable that $0.9 \leq x \leq 1.6$, $1.8 < y < 2.0$, when a composition of the first oxide layer is HfO$_x$ and a composition of the second oxide layer is HfO$_y$, and the thickness of the second oxide layer is equal to or greater than 3 nm and equal to or less than 4 nm.

In a case where zirconium is used as the transition metal element M in the bipolar variable resistance element, it is preferable that $0.9 \leq x \leq 1.4$, $1.9 < y < 2.0$, when a composition of the first oxide layer is ZrO$_x$ and a composition of the second oxide layer is ZrO$_y$, and the thickness of the second oxide layer is equal to or greater than 1 nm and equal to or less than 5 nm.

In the case of the unipolar variable resistance element, Ni, Nb, Hf, Zr, Co, Cu, Ti, W, etc., may be used as the transition metal element M.

In the variable resistance element of the present embodiment, since the protective layer is placed on the upper electrode, it is possible to prevent variation in thicknesses or volumes of upper electrodes, which variation would be caused by over-etching during formation of the upper contact hole, or a reaction which would occur between the material of the upper contact plug and the material of the upper electrode. This can lessen non-uniformity (number or length of the hillocks) of hillocks formed on the upper electrodes, and non-uniformity of voltages required for initial breakdown. Therefore, the resistance changing operation associated with the redox reaction can take place more stably, and non-uniformity among elements can be lessened.

Manufacturing Method of Element

Figure 2A:
Figure 2B:
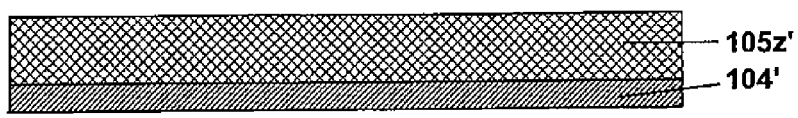
Figure 2C:
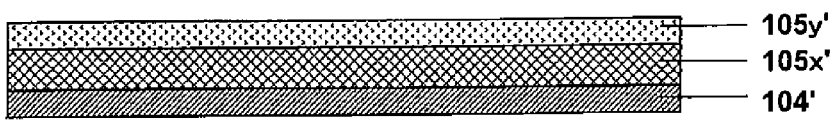
Figure 2D:
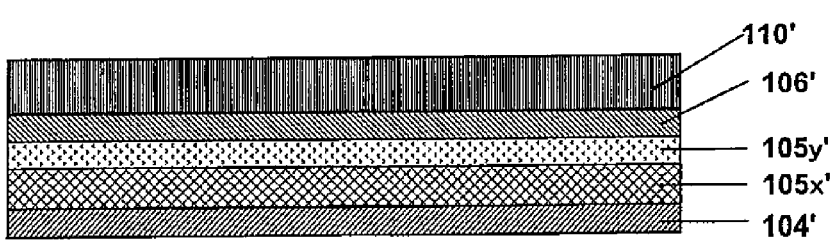
Figure 2E:
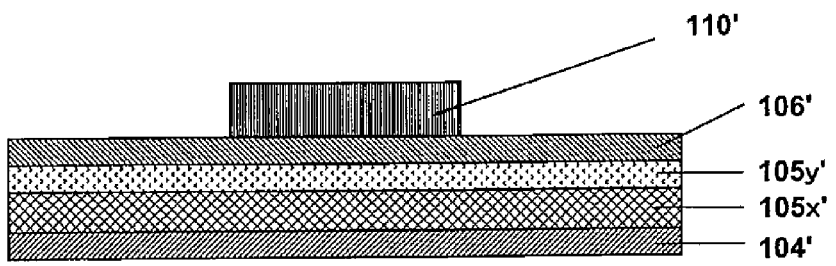
Figure 2F:
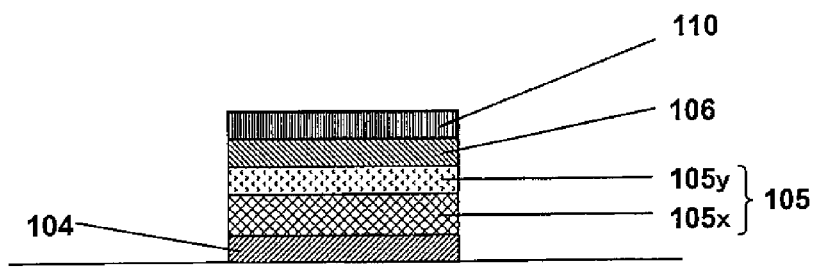

FIGS. 2A to 2F and FIGS. 3A to 3D are cross-sectional views showing process steps of a manufacturing method of the variable resistance element according to Embodiment 1 of the present invention. FIG. 2A is a view showing the step of forming a lower electrode material layer 104' formed on the interlayer insulating layer (not shown) formed on the substrate (not shown), FIG. 2B is a view showing the step of forming an oxide material layer 105$z$', FIG. 2C is a view showing the step of forming a second oxide material layer 105$y$' and a first oxide material layer 105$x$', FIG. 2D is a view showing the step of forming an upper electrode material layer 106' and a protective material layer 110', FIG. 2E is a view showing the step of etching the protective material layer 110', and FIG. 2F is a view showing the step of etching the upper electrode material layer 106', the second oxide material layer 105$y$', the first oxide material layer 105$x$' and the lower electrode material layer 104', together, using the protective material layer 110' of FIG. 2E as a mask, to form the lower electrode 104, the first oxide layer 105$x$, the second oxide layer 105$y$, the upper electrode 106 and the protective layer 110, respectively. Since the protective material layer 110' is used as the mask during etching, the thickness of the resulting protective layer 110 is less than the thickness of the protective material layer 110' initially formed.

Figure 3A:
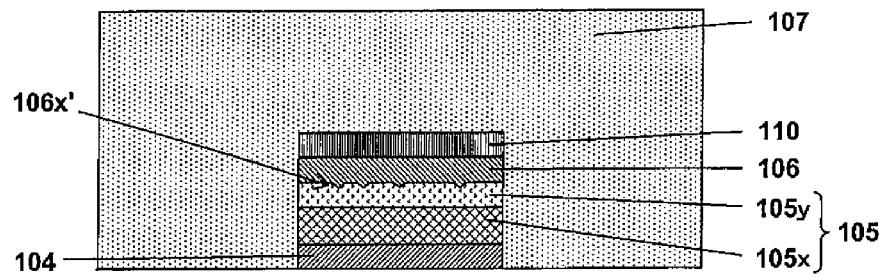
FIGS. 3A to 3D are cross-sectional views showing process steps of the manufacturing method of the variable resistance element according to Embodiment 1 of the present invention, in which 3A is a view showing the step of forming a second interlayer insulating layer.
Figure 3B:
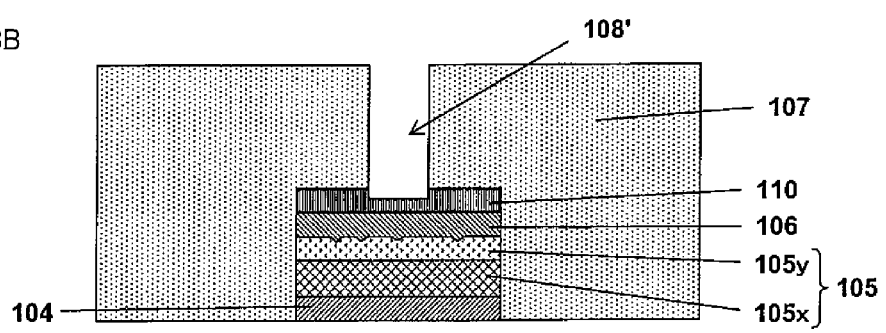
Figure 3C:
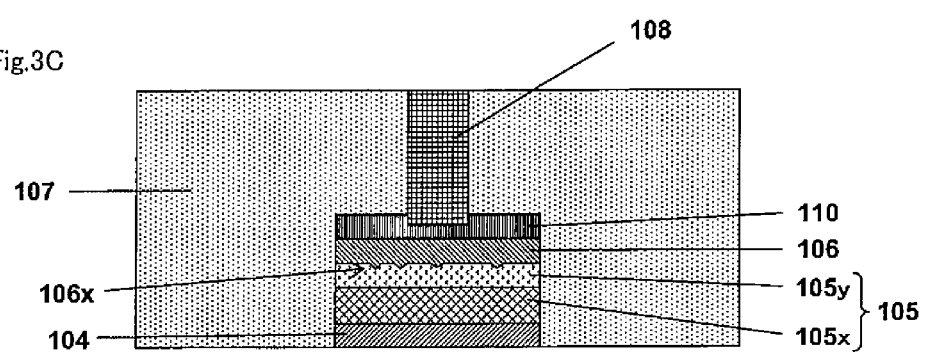
Figure 3D:
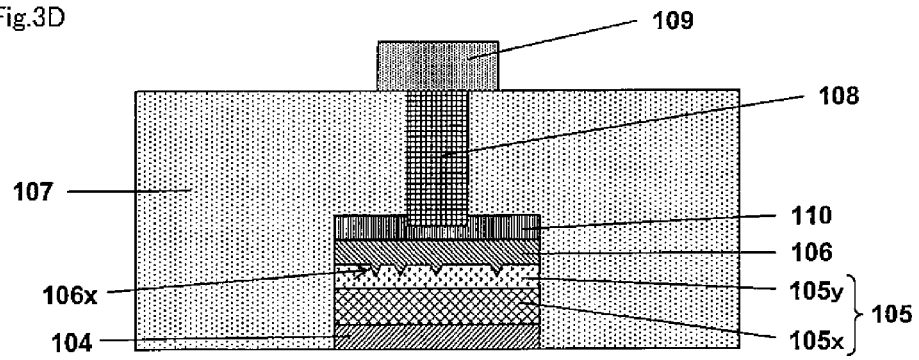

FIG. 3A is a view showing the step of forming the second interlayer insulating layer 107, FIG. 3B is a view showing the step of forming an upper contact hole 108' in the second interlayer insulating layer 107, FIG. 3C is a view showing the step of forming the upper contact plug 108 inside the upper contact hole 108', and FIG. 3D is a view showing the step of forming the upper wire 109. In FIGS. 2 and 3, the substrate 100, the lower wire 101, the first interlayer insulating layer 102 and the lower contact plug 103 are omitted. A transistor and a circuit for driving a variable resistance element and a variable resistance element array is provided on the substrate, generate electric signals required to drive the variable resistance element and the variable resistance element array, and supply the electric signals to the variable resistance element and the variable resistance element array.

As shown in FIGS. 2 and 3, the method of manufacturing the variable resistance element according to Embodiment 1 includes, when M is a particular transition metal element and O is oxygen, the step of forming the lower electrode material layer 104' (FIG. 2A), the step of forming, on the lower electrode material layer 104', the first oxide material layer 105$x$' comprising MO$_x$ when a content ratio of O with respect to M is x (x: positive number), and the second oxide material layer 105$y$' comprising MO$_y$ when a content ratio of O with respect to M is y (y>x) in this order (FIGS. 2B and 2C), the step of forming the upper electrode material layer 106' on the second oxide material layer 105$y$' (FIG. 2D), the step of forming on the upper electrode material layer 106', the protective material layer 110' having a composition different from that of the upper electrode material layer 106' (FIG. 2D), the step of processing the lower electrode material layer 104,' the first oxide material layer 105$x$,' the second oxide material layer 105y,' the upper electrode material layer 106,' and the protective material layer 110' in a predetermined shape to form the lower electrode 104, the first oxide layer 105x, the second oxide layer 105y, the upper electrode 106, and the protective layer 110, respectively, (FIGS. 2E and 2F), the step of forming the interlayer insulating layer (second interlayer insulating layer 107) such that the interlayer insulating layer covers the protective layer 110 (FIG. 3A), the step of forming the upper contact hole 108' such that the upper contact hole 108' penetrates the interlayer insulating layer (second interlayer insulating layer 107), the protective layer 110' is exposed on a bottom thereof and the upper electrode 106 is not exposed on the bottom thereof (FIG. 3B), the step of forming the upper contact plug 108 inside the upper contact hole 108' (FIG. 3C), and the step of forming the upper wire 109 such that the upper wire 109 contacts the upper contact plug 108 (FIG. 3D). At this time, the upper electrode 106 is heated by a wiring process step (heating process step). By heating the upper electrode 106, the plurality of hillocks 106x are formed such that the hillocks 106x protrude into the second oxide layer 105y and do not pierce the second oxide layer 105y.

To manufacture the constituents shown in FIG. 1, initially, the lower wire 101, the first interlayer insulating layer 102, and the lower contact plug 103 are required to be formed on the substrate 100. As such a method, a well-known technique may be employed. The technique is obvious to those skilled in the art and will not be described.

In a state where the first interlayer insulating layer 102 and the lower contact plug 103 are planarized such that their upper end surfaces are coplanar with each other, the lower electrode material layer 104' comprising, for example, a tantalum nitride, is deposited on the first interlayer insulating layer 102 and the lower contact plug 103, by a reactive sputtering method, using, for example, a tantalum target (Ta target) in a mixture gas atmosphere of argon (Ar) and nitrogen (N), as shown in FIG. 2A.

Then, as shown in FIG. 2B, the oxide material layer 105z' comprising, for example, a tantalum oxide, is deposited with a thickness of, for example, 50 nm, on the lower electrode material layer 104,' by a reactive sputtering method, in which, for example, a tantalum target is sputtered in an oxygen gas atmosphere.

Then, as shown in FIG. 2C, the upper portion of the oxide material layer 105z' is oxidized by plasma oxidation, to form the second oxide material layer 105y' having a thickness which is, for example, equal to or greater than 5 nm and equal to or less than 8 nm. A non-oxidized portion of the oxide material layer 105' becomes the first oxide material layer 105x.' The first oxide material layer 105x' has a thickness which is equal to or greater than 42 nm and equal to or less than 45 nm. By setting processing time and processing conditions of the plasma oxidation appropriately, the thickness and oxygen content of the second oxide material layer 105y' can be adjusted.

Then, as shown in FIG. 2D, the upper electrode material layer 106' and the protective material layer 110' are deposited on the second oxide material layer 105y', by, for example, a sputtering method, such that the upper electrode material layer 106' has a thickness which is, for example, equal to or greater than 15 nm and equal to or less than 50 nm, and the protective material layer 110' has a thickness which is, for example, 100 nm. The thicknesses of these layers are determined suitably depending on the material of the second interlayer insulating layer 107, a selectivity with the protective material layer 110' determined by the material of the second interlayer insulating layer 107 (e.g., selectivity between $SiO_2$ and TiAlN), the thicknesses of the layers, and non-uniformity thereof.

Then, as shown in FIG. 2E, the protective material layer 110' is patterned in a predetermined shape using, for example, a mask (not shown) having a predetermined shape and formed by a photoresist, by, for example, dry-etching using a mixture gas of $Cl_2$ (150 sccm), Ar (300 sccm) and $CHF_3$ (5 sccm), and thereafter the photoresist mask is removed.

Then, as shown in FIG. 2F, the upper electrode material layer 106', the second oxide material layer 105y', the first oxide material layer 105x', and the lower electrode material layer 104' are patterned in a predetermined shape, using the protective material layer 110' having the predetermined shape as a hard mask, by, for example, etching using a mixture gas of $Cl_2$ (60 sccm), Ar (170 sccm) and $O_2$ (30 sccm). Through this etching step, the protective layer 110, the upper electrode 106, the second oxide layer 105y, the first oxide layer 105x, and the lower electrode 104 are formed. Because of an influence of the etching, the protective layer 110 is thinner than the protective material layer 110' of FIG. 2E.

Then, as shown in FIG. 3A, a layer comprising, for example, silicon dioxide, is deposited with a thickness of, for example, 200 nm by, for example, a plasma CVD method such that this layer covers the first interlayer insulating layer 102 (not shown), the protective layer 110, the upper electrode 106, the second oxide layer 105y, the first oxide layer 105x and the lower electrode 104. The layer comprising silicon dioxide is heated at 400 degrees C. for 10 minutes to have a dense structure, thereby forming the second interlayer insulating layer 107. As a result of the heating process step, the hillocks 106x' being grown are accomplished on the upper electrode 106. The length of the hillocks 106x' being grown is shorter than the length b of the hillocks 106x of FIG. 1.

Then, as shown in FIG. 3B, the upper contact hole 108' is formed to penetrate the second interlayer insulating layer 107 from the upper end surface of the second interlayer insulating layer 107 to the protective layer 110, by dry-etching using a desired mask. Conditions and time for the dry-etching are adjusted to prevent the upper contact hole 108' from piercing the protective material layer 110' and reaching the upper electrode 106. In the example of FIG. 3B, the lower end portion of the upper contact hole 108' extends to a portion of the protective layer 110 which is under the upper surface of the protective layer 110, and a part of the protective layer 110 is removed by etching.

Then, as shown in FIG. 3C, for example, titanium/titanium nitride (Ti/TiN) is deposited by a sputtering/CVD method, as the adhesion layer/barrier layer such that the adhesion layer has a thickness of 10 nm and the barrier layer has a thickness of 12 nm, and tungsten (W) is deposited with a thickness of 250 nm by, for example, a CVD method, as a filling layer, and titanium/titanium nitride and tungsten on the second interlayer insulating layer 107 are removed by a CMP method, thereby forming the upper contact plug 108 inside the upper contact hole 108.' Instead of the CVD method or the CMP method, another deposition method such as plating, or a removing method such as etch-back may be used.

Finally, as shown in FIG. 3D, for example, aluminum is deposited by, for example, a sputtering method such that aluminum covers the upper contact plug 108 exposed on the upper end surface of the second interlayer insulating layer 107, and the upper wire 109 is formed by dry-etching using a desired mask such that the upper wire 109 covers the upper contact plug 108 exposed on the upper end surface of the second interlayer insulating layer 107. Then, for the purpose of sintering, a heating process is conducted for 10 minutes in a nitrogen atmosphere of, for example, 400 degrees C. (heating process step). In this heating process step, growth of the hillocks 106x on the upper electrode 106 is accomplished, and thus the variable resistance element 10 is completed.

Note that the first oxide material layer 105x' and the second oxide material layer 105y' may be deposited separately by, for example, a sputtering method. By adjusting the flow rate of oxygen gas during formation of these layers, a value of x of the first oxide layer ($TaO_x$) and a value of y of the second oxide layer ($TaO_y$) may be adjusted individually, or the second oxide layer may be deposited by, for example, a sputtering method using an oxide target having an oxygen content adjusted separately. The thickness of the second oxide layer can be set to equal to or greater than 5 nm and equal to or less than 8 nm, by adjusting sputtering conditions and sputtering time.

In a case where hafnium is used as the transition metal element M, an oxide material layer is deposited on a lower electrode material layer by a reactive sputtering method in which sputtering is performed using a Hf target in an argon and oxygen gas atmosphere. In a case where zirconium is used as the transition metal element M, an oxide material layer is deposited on a lower electrode material layer by a reactive sputtering method in which sputtering is performed using a Zr target in the argon and oxygen gas atmosphere.

In either case, the surface of the oxide material layer is oxidized by plasma oxidation using plasma of argon gas and oxygen gas after formation of the oxide material layer, thereby forming the first oxide material layer and the second oxide material layer. The oxygen content of the first oxide layer can be adjusted easily by changing a flow ratio of the oxygen gas to the argon gas in the reactive sputtering method. A substrate temperature can be set to a room temperature without performing heating. The thickness and oxygen content of the second oxide layer can be adjusted easily by changing a time of the plasma oxidation using the plasma of the argon gas and the oxygen gas.

The upper electrode material layer 106' comprises precious metal such as platinum. It is relatively difficult to etch the upper electrode material layer 106' using a photoresist as a mask, because of a low etching rate of the precious metal such as platinum. Typically, precious metal is etched using a metal oxide or a metal nitride as a hard mask. In the manufacturing method of the variable resistance element of the present embodiment, the protective material layer 110' comprising the nitride of alloy of titanium and aluminum or the titanium nitride is utilized as the hard mask during etching of the upper electrode material layer 106'. This can reduce the layers (including the mask or the like) formed through the manufacturing process steps, and hence make the manufacturing process steps more simplified and more efficient.

Example 1

(1) Manufacturing Conditions, etc.

In Example 1, the variable resistance element having the configuration of FIG. 1 was manufactured using the above stated manufacturing method of Embodiment 1.

Regarding the materials of the respective constituents, the substrate comprised silicon, the lower wire comprised aluminum, the first interlayer insulating layer comprised silicon dioxide ($SiO_2$), the lower contact plug comprised titanium/titanium nitride (Ti/TiN) being 10 nm/12 nm in thickness, as the adhesion layer/barrier layer, respectively, and tungsten (W) as the filling layer, the lower electrode comprised tantalum nitride (TaN) having a thickness of 30 nm, the first oxide layer comprised tantalum oxide ($TaO_x$: x=1.6) having a thickness of 45 nm, the second oxide layer comprised a tantalum oxide ($TaO_y$: y=2.48) having a thickness of 5 nm, the upper electrode comprised platinum having a thickness of 50 nm, the protective layer comprised titanium aluminum nitride (TiAlN) having a thickness of 50 nm, the second interlayer insulating layer comprised silicon dioxide ($SiO_2$) having a thickness of 50 nm, the upper contact plug comprised titanium/titanium nitride (Ti/TiN) being 10 nm/12 nm in thickness, as the adhesion layer/barrier layer, respectively, and tungsten (W) as the filling layer, and the upper wire comprised aluminum.

The lower wire and the upper wire were formed by a sputtering method, and by dry-etching using a mask. The first interlayer insulating layer was deposited by a plasma CVD method. The lower contact hole into which the lower contact plug was filled was formed by dry-etching using a mask. The lower contact plug was formed in such a manner that the adhesion layer/barrier layer (Ti/TiN) were deposited by the sputtering method/CVD method, respectively, and the filling layer (W) was deposited by the CVD method. The lower electrode material layer, the upper electrode material layer, and the protective material layer were deposited by the sputtering method. As these deposition methods, well-known methods can be used, and detailed description thereof will not be given in repetition.

The oxide material layer was deposited by a reactive sputtering method in which sputtering was performed using a target comprising a simple substance tantalum in an atmosphere containing oxygen gas. The thickness of the oxide material layer was measured by spectroscopic ellipsometry and was 50 nm. The sputtering conditions were such that a power was 1000 W, a pressure was 0.05 Pa, and a gas flow rate was $Ar/O_2$=20/23 sccm. The composition (value of x of $TaO_x$) of the oxide material layer and of the first oxide layer was measured in such a manner that the tantalum oxide with a thickness of 100 nm was formed under the above conditions, and the composition of the formed tantalum oxide was measured by RBS (Rutherford Backscattering Spectrometry). A measurement value was x=1.6.

The second oxide layer was produced by oxidizing the surface of the oxide material layer by the plasma oxidation method. The plasma oxidation conditions were such that a power was 200 W, a pressure was 0.3 Pa, a substrate temperature was 300 degrees C., and exposure time was set to 15 seconds for the second oxide layer having a thickness of 5.5 nm, 20 seconds for the second oxide layer having a thickness of 6 nm, 27 seconds for the second oxide layer having a thickness of 6.5 nm, 37 seconds for the second oxide layer having a thickness of 7 nm, and 48 seconds for the second oxide layer having a thickness of 7.5 nm Please see Example 2 about the composition of the second oxide layer. The thickness of the second oxide layer was measured using spectroscopic ellipsometry. The thickness of the protective layer was measured by imaging the cross-section of the element using a scanning electron microscope (SEM) and was 54 nm. A design dimension of the upper contact plug was a square of (0.26 μm×0.26 μm).

The protective material layer was dry-etched using a mixture gas of $Cl_2$ (150 sccm), Ar (300 sccm) and $CHF_3$ (5 sccm). The etching conditions were such that a pressure was 0.5 pa, a high-frequency wave power supplied to ICP (inductively coupled plasma) generating apparatus was 700 W, and an RF bias power was 200 W.

The dry-etching conditions for the upper electrode material layer were such that a mixture gas of $Cl_2$ (60 sccm), Ar (170 sccm) and $O_2$ (30 sccm) was used, a pressure was 0.3 pa, an ICP power was 1500 W, and a bias power was 600 W.

The dry-etching conditions for the second oxide layer, the first oxide layer and the lower electrode material layer were such that a mixture gas of $SF_6$ (70 sccm) and HBr (20 sccm) was used, a pressure was 1.0 Pa, an ICP power was 300 W, and a bias power was 200 W.

The second interlayer insulating layer was deposited by the plasma CVD method. The conditions of the CVD were such that $Si(OC_2H_5)_4$ was used as material gas, $O_2$ (18000 sccm) was used as a reactive gas, a pressure was 3.2 Torr., a temperature was 350 degrees C., a high-frequency wave RF output was 500 W, and a low-frequency wave RF output was 1200 W. Thereafter, the second interlayer insulating layer was exposed in an atmosphere of 400 degrees C., for 10 minutes, to form a dense structure of the silicon dioxide layer. The thickness of the second interlayer insulating layer on the protective layer was about 300 nm.

The upper contact hole into which the upper contact plug was filled was formed by dry-etching using a mask. The mask material was a photoresist. The dry-etching conditions were such that a mixture gas of $C_5F_8$ (17 sccm), Ar (500 sccm), and $O_2$ (23 sccm) was used, a pressure was 2.7 Pa, an ICP power was 1800 W, and a bias power was 1800 W. Thus, the bottom of the upper contact hole reached the protective layer, and did not pierce the protective layer such that the upper electrode was not exposed on the bottom of the upper contact hole.

The upper contact plug was deposited in such a manner that the adhesion layer/barrier layer were deposited by the sputtering method/CVD method, respectively and the filling layer was deposited by the CVD method. The adhesion layer/barrier layer were formed in such a manner that Ti was deposited as the adhesion layer under sputtering conditions in which a power was 3500 W, a draw-in bias power was 3000 W, and a pressure was 35 mTorr., and then TiN was deposited as the barrier layer under the conditions in which Ti $[N(CH_3)_2]_4$ was used as material gas, and $N_2$ (200 sccm) and $H_2$ (300 sccm) were used as reactive gases, a pressure was 1.3 Torr, a power was 750 W, and a heater temperature was 450 degrees C. The filling layer was deposited for 17 seconds under the condition in which $WF_6$ (40 sccm) was used as material gas and $SiH_4$ (27 sccm) and $H_2$ (1000 sccm) were used as reactive gases, a pressure was 30 Torr. and a heater temperature was 450 degrees C. Then, the filling layer was treated for 23 seconds under the condition in which $WF_6$ (95 sccm) was used as material gas and $H_2$ (700 sccm) was used as reactive gas, a pressure was 30 Torr., and a heater temperature was 450 degrees C.

After formation of the element, the element was heated at 400 degrees C. for 10 minutes in a nitrogen atmosphere, for the purpose of sintering. That is, after formation of the upper electrode material layer, the upper electrode material layer was heated at 400 degrees C. for 10 minutes during formation of the second interlayer insulating layer and at 400 degrees C. for 10 minutes during the sintering. After formation of the upper contact hole, the upper electrode material layer was heated at 400 degrees C. for 10 minutes during the sintering. In a case where there was no protective layer, it was likely that the hillocks had non-uniformity, due to non-uniformity of thicknesses of upper electrode material layers, in a latter case (heating process step after formation of the upper contact hole). The other steps did not contribute to the formation of the hillocks because a temperature was low.

To review non-uniformity of characteristics among elements within the same wafer, five pieces of wafers were manufactured in such a manner that an element area was 0.25 $\mu m^2$ (square of 0.5 $\mu m \times 0.5$ $\mu m$) and the thicknesses of second oxide layers were 5.5 nm, 6 nm, 6.5 nm, 7 nm, and 7.5 nm, respectively. 528 variable resistance elements in total were manufactured (44 chips per wafer, 12 elements per chip).

To review an influence of the element area, ten kinds of variable resistance elements were manufactured in such a manner that the element areas were set to 0.25 $\mu m^2$, 0.21 $\mu m^2$, 0.36 $\mu m^2$, 0.49 $\mu m^2$, 0.64 $\mu m^2$, 0.81 $\mu m^2$, 1.00 $\mu m^2$, 4.00 $\mu m^2$, 25.0 $\mu m^2$, and 100 $\mu m^2$ to correspond to each of the second oxide layers which were 6 nm and 6.5 nm in thickness, respectively.

(2) Cross-section Photograph of Element

Figure 4A:
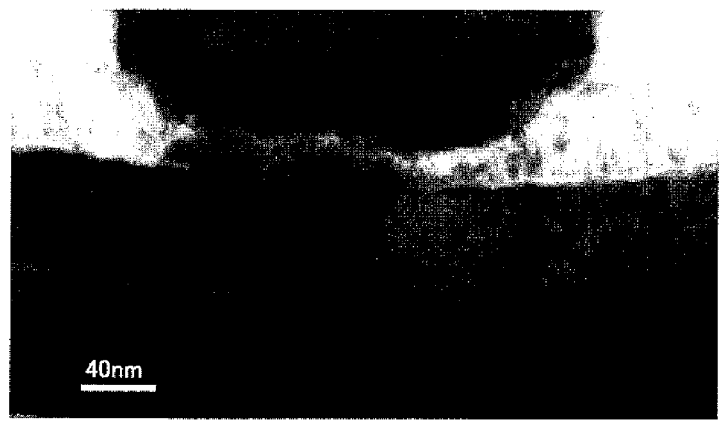
Figure 4B:
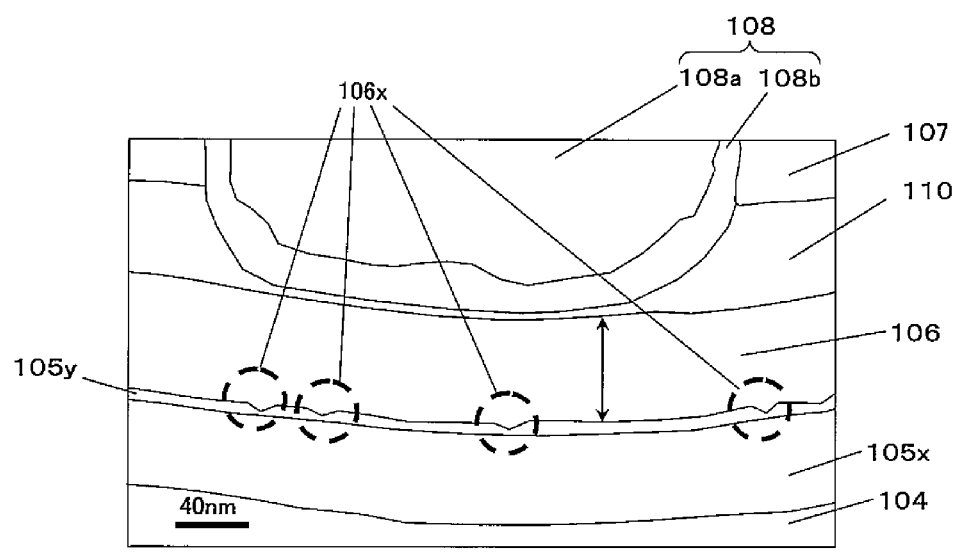

FIGS. 4A and 4B are views showing the cross-section of major constituents of the variable resistance element according to Example 1, in which FIG. 4A is a transmission electron micrograph, and FIG. 4B is a trace diagram of the transmission electron micrograph of FIG. 4A. Reference symbols in FIG. 4B are identical to those of FIG. 1, and description of them will not be given in repetition. In FIG. 4B, an arrow indicates a thickness of an upper electrode. A sample shown in FIG. 4 has a structure in which the thickness of a second oxide layer is 7 nm and an element area is 0.25 $\mu m^2$.

As indicated by broken-line circles of FIG. 4B, in the variable resistance element of Embodiment 1, a plurality of hillocks 106x protrude from the upper electrode 106 into the second oxide layer 105y.

The second oxide layer 105y has a plurality of locally thinned portions in portions defined by the broken-line circles.

The second oxide layer 105y has concave portions and hence the plurality of locally thinned portions in the portions defined by the broken-line circles.

The length of the hillocks 106x is about 4 nm. The thickness of the second oxide layer 105y is about 7 nm. In other words, the length of the hillocks 106x is less than the thickness of the second oxide layer 105y.

The hillocks 106x are not physically in contact with the first oxide layer 105x.

The interface between the first oxide layer 105x and the second oxide layer 105y is flat, while the interface between the second oxide layer 105y and the upper electrode 106 has concave and convex portions, thereby causing the second oxide layer 105y to have the plurality of locally thinned portions, in the portions defined by the broken-line circles.

The upper electrode 106 has the hillocks 106x on the interface between the second oxide layer 105y and the upper electrode 106, thereby allowing the second oxide layer 105y to have the plurality of locally thinned portions.

In FIG. 4, the lower end portion of the upper contact plug 108 comprising the adhesion layer/barrier layer 108b and the filling layer 108a protrude into the protective layer 110, and a part of the protective layer 110 is removed by etching. Since the protective layer 110 is placed between the upper contact plug 108 and the upper electrode 106, the upper contact plug 108 and the upper electrode 106 are not physically in contact with other.

Figure 5A:
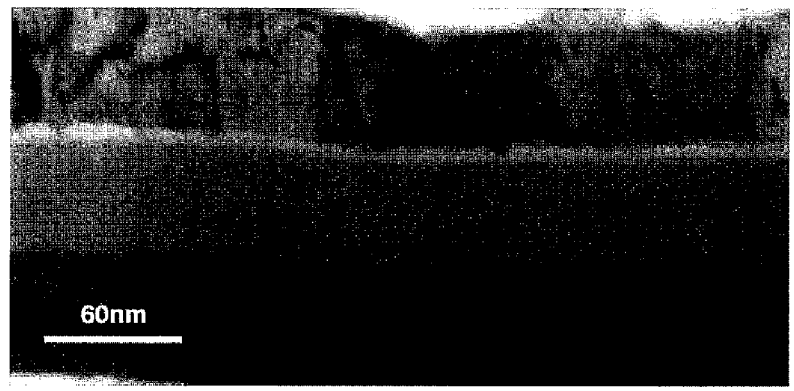
Figure 5B:
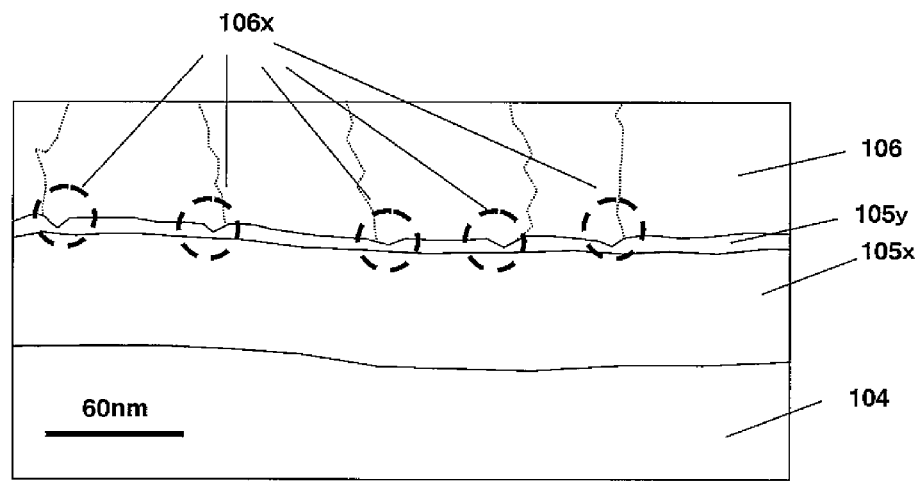

FIGS. 5A and 5B are enlarged views of the interface between the upper electrode and the second oxide layer in the variable resistance element according to Example 1, in which FIG. 5A is a transmission electron micrograph, and FIG. 5B is a trace diagram of the transmission electron micrograph of FIG. 5A. Reference symbols in FIG. 5B are identical to those of FIG. 1, and description of them will not be given in repetition.

As can be seen from FIGS. 5A and 5B, the hillocks 106x or the concave portions are formed along grain boundaries (portion indicated by broken lines in FIG. 5B) of the material (Pt) constituting the upper electrode 106. It is presumed that the material constituting the upper electrode 106 has migrated to the second oxide layer 105y along the grain boundaries. There may be a chance that the material constituting the second oxide layer 105y has protruded into the upper electrode along the grain boundaries prior to the migration. In other words, there may be a chance that the material constituting the upper electrode has migrated into the oxide layer to make up for the oxide having protruded into the upper electrode.

(3) Resistance Changing Operation

Figure 6:
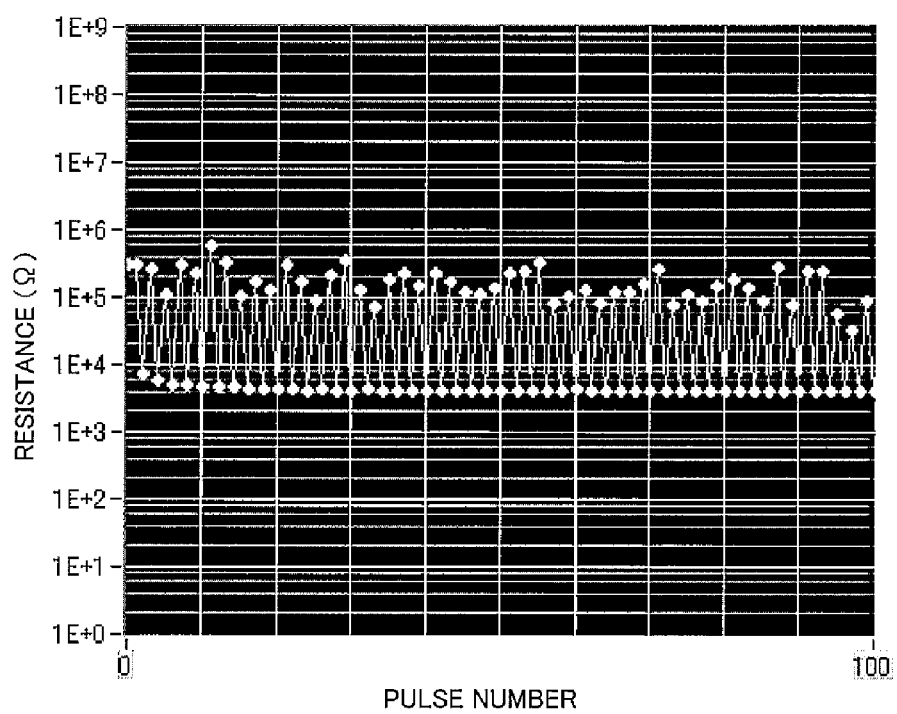
FIG. 6 is a view showing an exemplary resistance changing operation of the variable resistance element according to Example 1.

FIG. 6 is a view showing an exemplary resistance changing operation of the variable resistance element according to Example 1. A sample shown in FIG. 6 had a structure in which the thickness of the second oxide layer was 8 nm and an element area was 0.25 μm².

To confirm the resistance changing operation, electric pulses which were different in polarity were applied alternately between the lower electrode and the upper electrode in the variable resistance element (hereinafter applying the electric pulses between the lower electrode and the upper electrode is expressed as "applying the electric pulses to the variable resistance element"), and a resistance value (electric resistance) between the lower electrode and the upper electrode was measured, after every application of the electric pulse (hereinafter resistance value between the lower electrode and the upper electrode is referred to as "resistance value of variable resistance element"). The polarity and magnitude of the electric pulse were identified based on the electric potential of the upper electrode on the basis of the lower electrode. In other words, a case where the upper electrode was higher in electric potential than the lower electrode was a positive voltage.

When a negative electric pulse (voltage −1.0V, pulse width 100 ns) was applied, the variable resistance element according to Example 1 changed from a high-resistance state (resistance value: about 100 kΩ) to a low-resistance state (resistance value: about 4 kΩ). When a positive electric pulse (voltage +1.5V, pulse width 100 ns) was applied, the variable resistance element changed from the low resistance state to the high-resistance state. In brief, the variable resistance element exhibited a bipolar resistance changing operation.

In the example of FIG. 6, the high-resistance state can be allocated to information "0" and the low-resistance state can be allocated to information "1." In this setting, by applying the positive electric pulse, the variable resistance element changed to the high-resistance state, and the information "0" was written to the variable resistance element. On the other hand, by applying the negative electric pulse, the variable resistance element changed to the low-resistance state, and the information "1" was written to the variable resistance element.

When information was read from the variable resistance element, a read-out voltage (e.g., 0.5V) which was smaller in absolute value than the voltage applied to change the resistance state of the variable resistance element was applied. As a result, a current corresponding to the resistance value of the variable resistance element was output, and a value of the output current was detected, thereby enabling the written data to be read.

Example 2

In Example 2, the composition of the second oxide layer formed in Example 1 was identified. To be specific, the oxide material layer was formed on the silicon substrate under the same conditions as those used in Example 1, and was oxidized by plasma oxidation under the same conditions as those of Example 1, thereby forming the first oxide material layer and the second oxide material layer.

Figure 7:
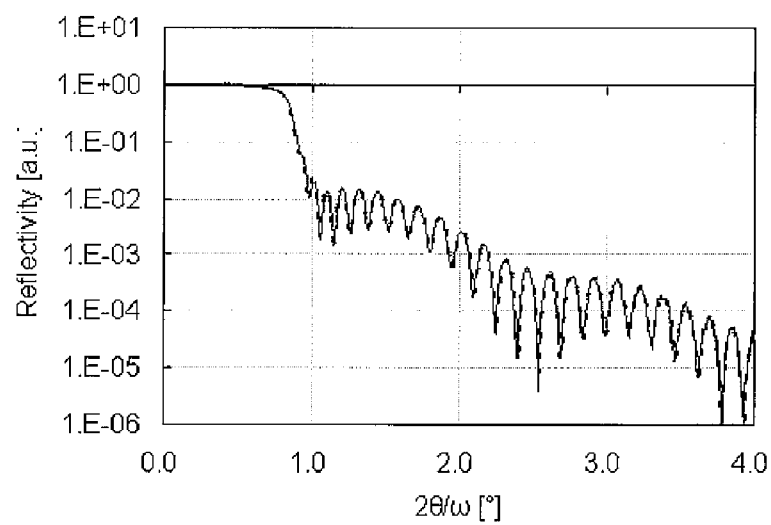
FIG. 7 is a view showing a result (solid line) of measurement of a second oxide layer by X-ray reflectivity and a fitting result (broken line) in Example 2.

FIG. 7 is a view showing a result (solid line) of measurement of the second oxide layer having a thickness of 5.5 nm by X-ray reflectivity and a fitting result (broken line) in Example 2. To perform the fitting, X-ray reflectivity data processing software manufactured by Rigaku Co., Ltd. was used. As shown in FIG. 7, the fitting result conformed to the measurement value well. By using the fitting result, a δ value (δ=1−n when a refraction index of the material with respect to X-ray is n) of the second oxide layer ($TaO_y$) was measured and was $20.9 \times 10^{-6}$. As generally known, δ of metal Ta is $39 \times 10^{-6}$, and δ of $Ta_2O_5$ is $22 \times 10^{-6}$. Based on the magnitude relation of the δ value, it was presumed that the oxygen content of the second oxide layer was higher than that of $Ta_2O_5$ which was a fixed ratio composition (stoichiometric composition). Therefore, it was presumed that the value of y in the second oxide layer satisfied y>2.5. The value of y satisfied y>2.1.

From the above results, it was found out that the composition of the second oxide layer of the variable resistance element manufactured in Example 1 satisfied y>2.1 when the second oxide layer was expressed as $TaO_y$.

Example 3

In Example 3, consideration was given to a correlation among the thickness of the upper electrode, the thickness of the second oxide layer, and the initial resistance (resistance value of a variable resistance element just after manufacture) in the variable resistance element. The configuration, manufacturing method, conditions and the like of the variable resistance element were identical to those of Embodiment 1, including the heating process step, except for the thickness of the second oxide layer and the thickness of the upper electrode.

In the present example, the thicknesses of the upper electrodes comprising platinum were set to 20 nm, 25 nm, 30 nm, and 40 nm, respectively. Among the upper electrodes, the thickness of the second oxide layer was made different by 0.5 nm from 5.5 nm to 7.5 nm (from 5.5 nm to 7.0 nm when the thicknesses of the upper electrodes were 20 nm and 30 nm, respectively), and the initial resistances of the elements were measured. The other materials and manufacturing conditions were set similarly to those of Example 1.

Figure 8:
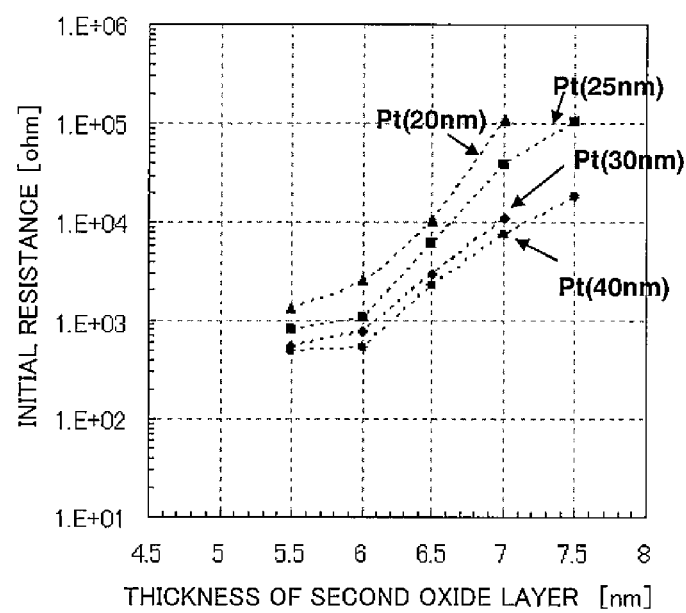
FIG. 8 is a view showing the relation between the thickness of an upper electrode, the thickness of a second oxide layer, and initial resistance in a variable resistance element in Example 3.

FIG. 8. is a view showing the relation between the thickness of the upper electrode, the thickness of the second oxide layer, and the initial resistance in the variable resistance element of Example 3.

It is considered that the initial resistance of the variable resistance element primarily originates from the second oxide layer having a relatively high resistivity. The magnitude of the initial resistance is determined by the thickness (difference (c−b) between the thickness c of the second oxide layer and the length b of the hillocks)) of the second oxide layer which is present between the first oxide layer and the upper electrode. It is estimated that as the hillocks are greater in length, the initial resistance decreases.

As can be seen from FIG. 8, when the thickness of the second oxide layer was constant, the initial resistance of the variable resistance element decreased as the thickness of the upper electrode increased. In other words, it was estimated that as the upper electrode was greater in thickness, the hillocks were greater in length. When the thickness of the upper electrode was constant, the initial resistance of the variable resistance element increased as the second oxide layer increased in thickness. From the above stated relation, it was found out that the initial resistance of the variable resistance element could be controlled based on the thickness of the second oxide layer and the thickness of the upper electrode.

By placing the protective layer on the upper electrode, it becomes possible to lessen non-uniformity of thicknesses of upper electrodes 106. As a result, the initial resistance of the variable resistance element can be controlled by adjusting the thickness of the upper electrode and the thickness of the second oxide layer.

Experimental Example 1

The height of the hillocks formed in Example 1 was as small as 5 nm or less. Therefore, it was difficult to measure the height of the hillocks by directly observing them using an electron micrograph or the like. The resistivity of the first oxide layer was 6 mΩcm and was metalloid, while the resistivity of the second oxide layer was as high as about $10^7$ mΩcm (equal to greater than million times of the resistivity of the first oxide layer). For this reason, the initial resistance of the variable resistance element is determined primarily by the resistance of a portion (portion corresponding to the difference (c−b) between the thickness c of the second oxide layer and the length b of the hillocks) of the second oxide layer which is thinnest. The thickness of the first oxide layer can be measured by spectroscopic ellipsometry. Therefore, it is considered that if the thickness of the second oxide layer is constant, the initial resistance is determined by the thickness of the portion of the second oxide layer corresponding to the difference (c−b) between the thickness c of the second oxide layer and the length b of the hillocks, and the initial resistance and the length b of the hillocks had a relation of 1:1. Therefore, the length b of the hillocks can be understood qualitatively based on the initial resistance of the variable resistance element.

In Experimental example 1, a suitable range of the thickness of the upper electrode was reviewed by researching how the initial resistance of the element changed, when the thickness of the upper electrode was made different. In the present experiment example, variable resistance elements in which the thicknesses of the upper electrodes were set to 5 nm, 8 nm, 10 nm, 13 nm, 20 nm, 25 nm, 35 nm, 40 nm, and 80 nm, respectively, were manufactured, and their initial resistances were measured. The material and manufacturing method were the same as those of Example 1, including the heating step.

Figure 9:
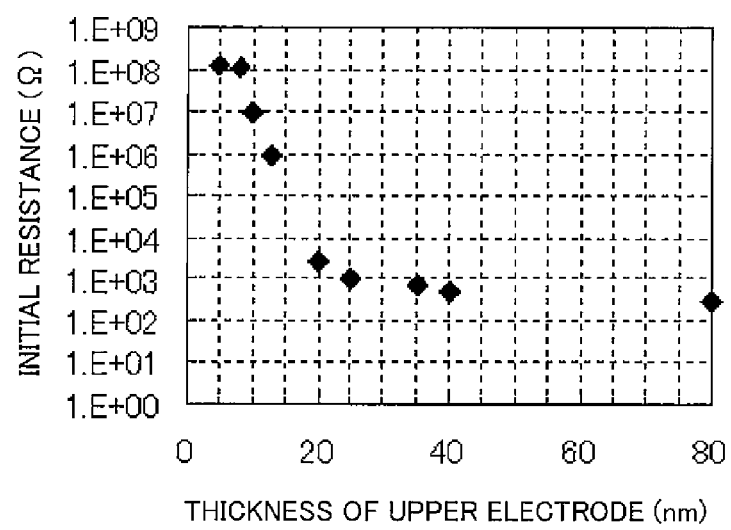
FIG. 9 is a view showing the relation between the thickness of an upper electrode and initial resistance in a variable resistance element in Experimental example 1.

FIG. 9 is a view showing the relation between the thickness of the upper electrode and the initial resistance in the variable resistance element in Experimental example 1.

As shown in FIG. 9, when the thicknesses of the upper electrodes were 5 nm and 8 nm, respectively, their initial resistances were about $10^8 \Omega$ and substantially constant. However, when the thickness of the upper electrode increased from 10 nm to 20 nm, the initial resistance decreased to about $10^3 \Omega$. When the thickness of the upper electrode exceeded 20 nm, the initial resistance was substantially constant.

The initial resistance of about $10^8 \Omega$ was substantially equal to the initial resistance ($2 \times 10^8 \Omega$) in the case where iridium Ir was used for the upper electrode (see Experimental example 3). As described in Example 3, when the upper electrode comprised iridium, no hillocks were formed on the upper electrode.

Figure 10A:
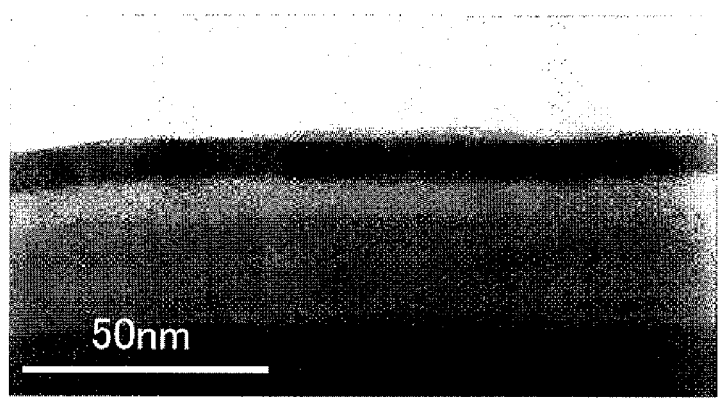
Figure 10B:
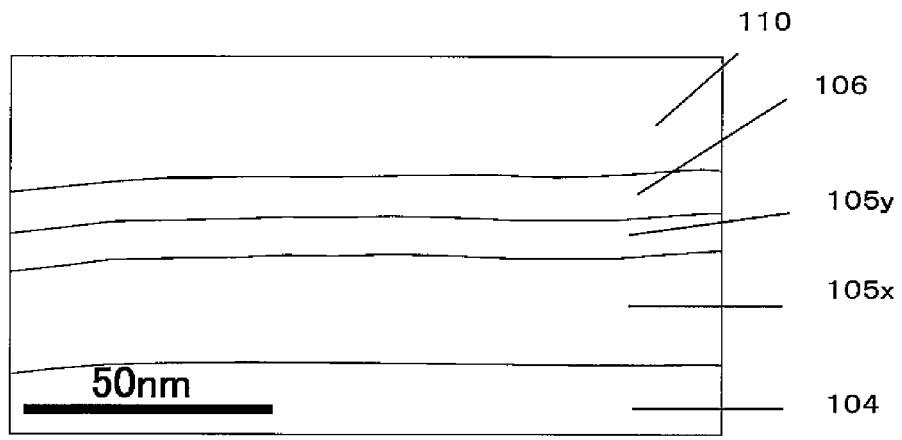

FIGS. 10A and 10B are views showing the cross-section of the variable resistance element in which the thickness of the upper electrode is set to 8 mm in Experimental example 1, in which FIG. 10A is a transmission electron micrograph, and FIG. 10B is a trace diagram of the transmission electron micrograph of FIG. 10A. Reference symbols in FIG. 10B are identical to those of FIG. 1, and will not be described.

As shown in FIGS. 10A and 10B, in the variable resistance element in which the thickness of the upper electrode is set to 8 nm, the surface of the upper electrode is flat and smooth. It can be seen that no hillocks are formed on the upper electrode, or otherwise hillocks cannot be observed because of its minuteness, if they are formed on the upper electrode.

It is presumed that in the case where the thickness of the upper electrode is very small, for example, 5 nm or 8 nm, the hillocks are not virtually formed, and thereby the element exhibits the initial resistance similar to that in the case where Ir is used for the upper electrode. On the other hand, if the thickness of the upper electrode is greater than 10 nm, the formation of the hillocks is observed and the initial resistance decreases. If the thickness of the upper electrode is greater than 20 nm, the formation amount of the hillocks is substantially constant, and the initial resistance is substantially constant. If the thickness of the upper electrode is greater than 25 nm, the formation amount of the hillocks is more constant, and the initial resistance is more constant.

Therefore, the thickness of the upper electrode is preferably greater than 10 nm, more preferably greater than 20 nm, and most preferably greater than 25 nm. To allow the formation amount of the hillocks to be constant, the thickness of the upper electrode is preferably greater than 35 nm, and more preferably greater than 40 nm. It is difficult to form the upper electrode by etching if the thickness of the upper electrode is too great (it is relatively difficult to process precious metal such as platinum or palladium which is a typical material of the upper electrode, by dry-etching). Therefore, the thickness of the upper electrode is preferably equal to or less than 100 nm.

Comparative Example

In Comparative example, a variable resistance element was manufactured to have a structure in which the protective layer was excluded from the variable resistance element of Embodiment 1.

To be specific, after the step of FIG. 3F, the protective layer 110 was removed completely by etching, and thereafter the step of FIG. 4 was performed. The protective layer 110 was etched by a method similar to that of Example 1. To be specific, in Comparative example, the protective layer 110 served only as the hard mask, and did not serve as the protective layer for the upper electrode 106.

As samples for which non-uniformity of characteristics among elements within the same wafer were reviewed, four wafers were created in such a manner that an element area was 0.25 µm$^2$ (square of 0.5 µm×0.5 µm), and the thicknesses of the second oxide layers were 5 nm, 5.5 nm, 6 nm, and 6.5 nm, respectively. In addition, samples for which influence of the element area were reviewed were created by manufacturing methods and conditions similar to those of Example 1 except for the above difference. The thickness of the upper electrode was set to about 50 nm.

Figure 11:
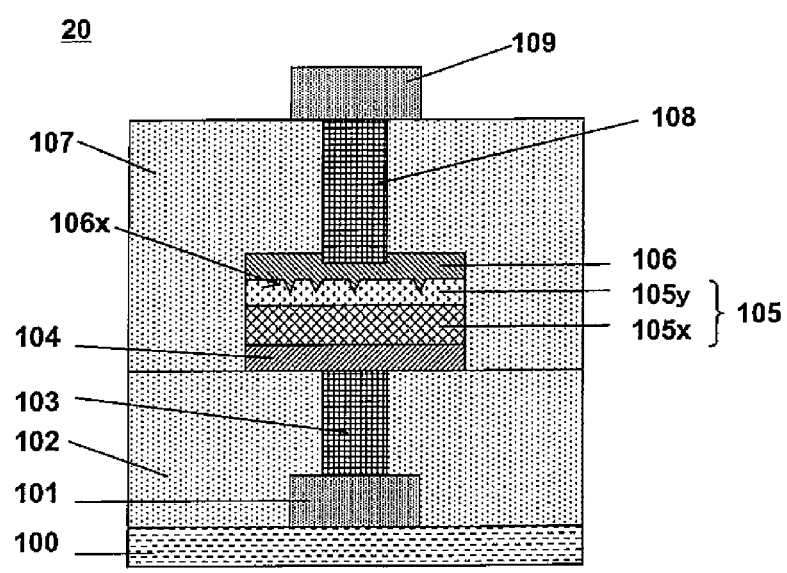
FIG. 11 is a cross-sectional view showing a schematic configuration of a variable resistance element according to Comparative example.

FIG. 11 is a cross-sectional view showing a schematic configuration of the variable resistance element according to Comparative example. In FIG. 11, the same constituents as those of FIG. 1 are designated by the same symbols and detailed description thereof will not be given in repetition.

Figure 12A:
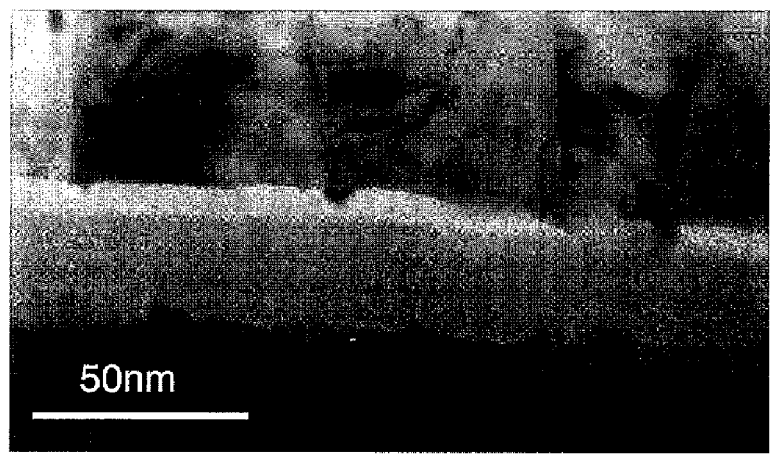
Figure 12B:
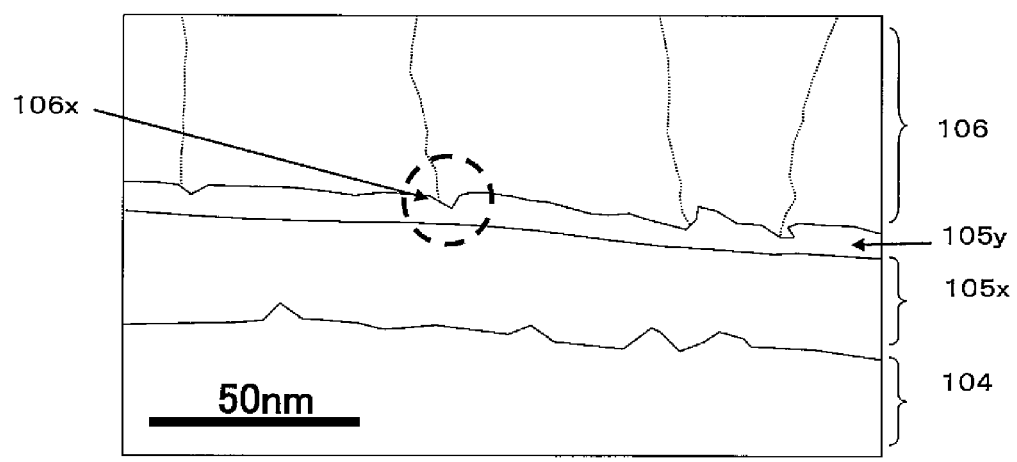

FIGS. 12A and 12B are views showing the cross-section of major constituents of the variable resistance element according to Comparative example, in which FIG. 12A is a transmission electron micrograph, and FIG. 12B is a trace diagram of the transmission electron micrograph of FIG. 12A. In FIG.

12B, the same constituents as those of FIG. 11 are designated by the same symbols and detailed description thereof will not be given in repetition. A sample shown in FIGS. 12A and 12B had a structure in which the thickness of a second oxide layer was 7 nm and an element area was 0.25 μm².

As shown in FIGS. 12A and 12B, in Comparative example, also, the hillocks 106*x* were formed along the grain boundaries of the upper electrode 106 at the interface between the upper electrode 106 and the second oxide layer 105*y*.

Comparison Between Example 1 and Comparative Example: Non-Uniformity of Characteristics FIGS. 13A and 13B are views showing non-uniformity of characteristics among elements in Example 1 and non-uniformity of characteristics among elements in Comparative example, which are for the purpose of comparison, in which FIG. 13A is a view showing non-uniformity of characteristics among elements, in the relation between the thickness of the second oxide layer and the initial resistance in Example 1 of the present invention, and 13B is a view showing non-uniformity of characteristics among elements, in the relation between the thickness of the second oxide layer and the initial resistance in Comparative example.

Figure 13A:
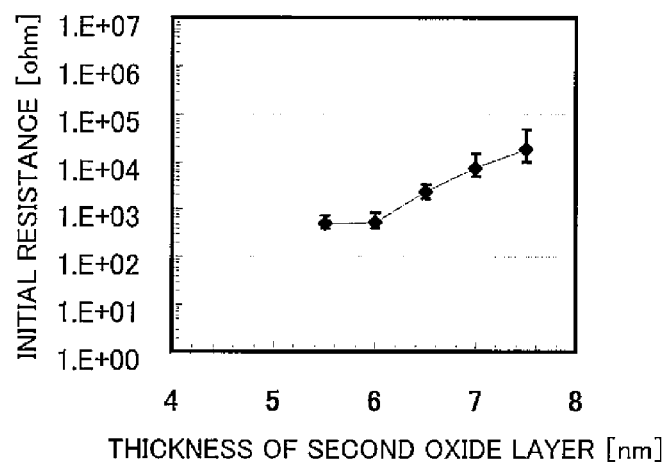
Figure 13B:
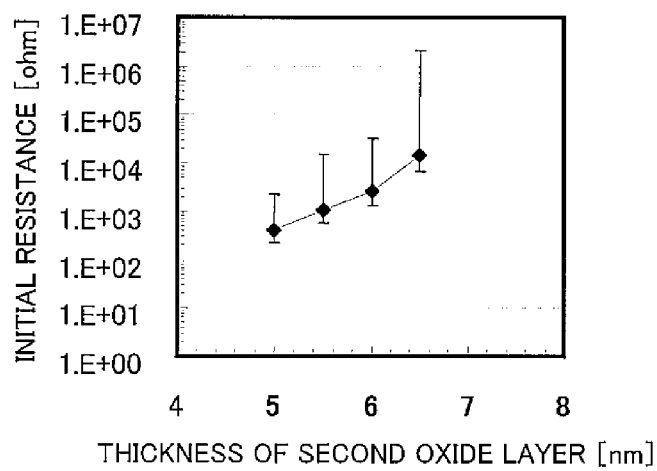

In FIGS. 13A and 13B, plots and error bars indicate an initial resistance distribution (average value, maximum value and minimum value) of 528 elements formed within the same wafer in each of Example 1 and Comparative example.

With reference to FIGS. 13A and 13B, there was non-uniformity of initial resistances among elements within the same wafer in Comparative example (FIG. 13B), whereas non-uniformity of initial resistances in Example 1 (FIG. 13A) was lessened significantly, as compared to Comparative example.

It was estimated that a cause of significant non-uniformity of characteristics in Comparative example was due to the fact that when over-etching was performed during formation of the upper contact hole, or the upper contact hole was filled with tungsten by the CVD method, the upper electrode and material gas of the tungsten CVD method reacted each other and a part of Pt of the upper electrode changed into alloy of Pt and W, and non-uniformity of thicknesses (volumes) of Pt of the upper electrodes occurred. The non-uniformity of thicknesses of Pt of the upper electrodes resulted in non-uniformity of lengths of the hillocks within the same wafer.

It was estimated that non-uniformity of characteristics in Example 1 was lessened because non-uniformity was lessened in thicknesses and volumes of the upper electrodes by placing the protective layers on the upper electrodes. The uniformity of thicknesses of the upper electrode resulted in uniformity of lengths of the hillocks within the same wafer.

Comparison Between Example 1 and Comparative Example: Influence of Element Area

Figure 14A:
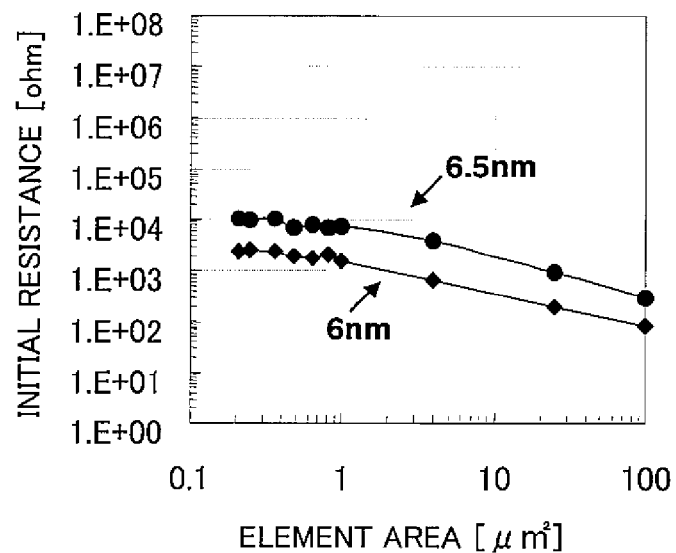
Figure 14B:
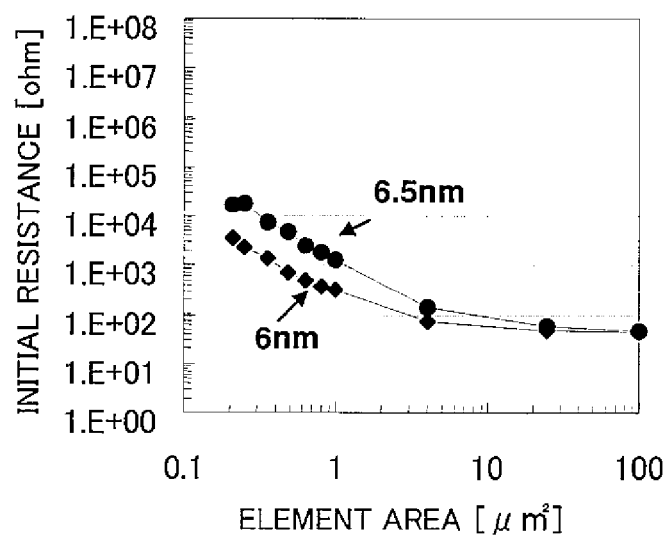

FIGS. 14A and 14B are views showing the relation between the area of the variable resistance element and the initial resistance of the variable resistance element in each of Example 1 and Comparative example, in which FIG. 14A shows the relation in Example 1 of the present invention, and FIG. 14B shows the relation in Comparative example.

The initial resistance of the variable resistance element should be inversely proportional to the element area of the variable resistance element. In FIGS. 14A and 14B, which are double logarithmic charts, the initial resistance and the element area should have a linear relationship. However, in Comparative example, dependency of initial resistance on dimension changed at a point at which the element area was 4 μm². It was estimated that this phenomenon was attributed to a change in a substantial thickness of the upper electrode, because of over-etching during formation of the upper contact hole, or reaction between the upper electrode and tungsten gas during formation of the upper contact plug. If there is no protective layer even in a case where the upper electrode material layer is formed as being 40 nm thick according to a design in a process step in the middle of the manufacturing process steps, the thickness of the upper electrode is likely to change in a later process step.

On the other hand, in Example 1, dependency of initial resistance on dimension was closer to a linear shape than that in Comparative example. It was presumed that in Example 1, the variable resistance element can have an initial resistance closer to a designed value than that in Comparative example, and the thickness of the upper electrode was less likely to change in a later process step.

Experimental Example 2

Figure 15A:
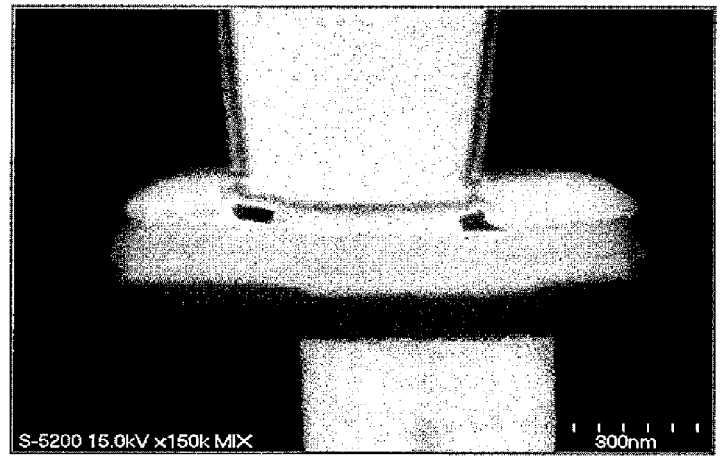
Figure 15B:
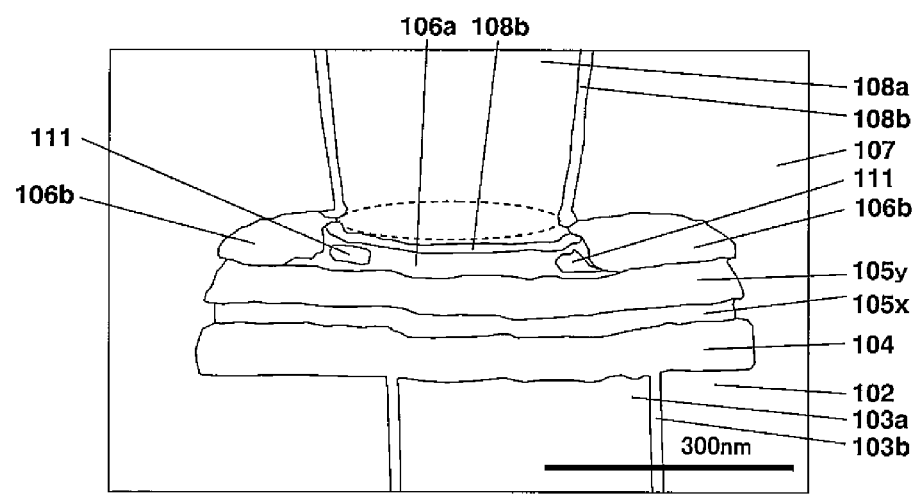

FIGS. 15A and 15B are views showing the cross-section of a variable resistance element according to Experimental example 2, in which FIG. 15A is a scanning electron microscope (SEM) photograph (scanning electron micrograph), and FIG. 15B is a trace diagram of the scanning electron micrograph of FIG. 15A. In FIG. 15B, the same constituents as those of FIG. 11 are designated by the same symbols and detailed description thereof will not be given in repetition. In Experimental example 2, the cross-section of the variable resistance element manufactured by a method similar to that of Comparative example was imaged by a scanning electron microscope and a cause of non-uniformity of the initial resistances was analyzed.

In FIGS. 15A and 15B, 108*b* designates titanium/titanium nitride (Ti/TiN) as the adhesion layer/barrier layer, and 108*a* designates tungsten (W) as the filling layer. As can be seen from FIGS. 15A and 15B, the adhesion layer/barrier layer 108*b* is cracked at a boundary potion between the bottom and the side surface of the upper contact hole. As the interlayer insulating layer, typically, silicon oxide is used like the present experimental example. Platinum or palladium, and alloy of these have low adhesivity to an insulating layer comprising the silicon oxide, and therefore the upper electrode is separated easily from the interlayer insulating layer. Such separation in the vicinity of the bottom of the upper contact hole may possibly cause the adhesion layer/barrier layer in the vicinity of the bottom to be cracked.

106*a* designates a portion where platinum was left as the upper electrode. 106*b* designates a portion where platinum formed as the upper electrode and the material gas (material gas in CVD method) of tungsten during formation of the upper contact plug reacted each other and resulted in alloy (alloy of platinum and tungsten). It was presumed that the material gas of tungsten leaked from the cracked portion and resulted in the alloy portion. The alloy portion would change a volume of portion comprising pure platinum and affect the degree to which the hillocks were formed, the number or length of the hillocks, etc.

111 designates voids. It was presumed that the voids were generated by the reaction between the material gas of tungsten and the upper electrode.

A portion surrounded by a broken line was a portion in which the upper electrode was eroded due to over-etching. It is extremely difficult to control an eroded amount of the upper electrode which occurs by over-etching. Even if the above crack or production of the alloy does not occur, it is difficult to control the thickness and volume of the upper electrode.

If Cu is used as the upper contact plug, a similar problem arises. Cu is deposited by plating. It is presumed that the thickness of the upper electrode changes in the same manner due to a reaction which would occur between a plating solution and the upper electrode.

From the result of Experimental example 2, the following deduction can be derived. If the interlayer insulating layer and the upper surface of the upper electrode comprising platinum, palladium, or alloy of these are physically in contact with each other, and the upper contact hole is formed in the interlayer insulating layer such that the upper contact hole reaches the upper electrode, the thickness and volume of the upper electrode will change, and non-uniformity occurs in the degree (number or length) of formation of the hillocks. Such non-uniformity may cause non-uniformity of characteristics among elements.

Experimental Example 3

To allow the variable resistance element to initiate a resistance changing operation, an electric pulse having a voltage greater than a voltage used to enable a normal resistance changing operation to occur is preferably applied to the variable resistance element after manufacture. The process allows an electric path to be formed inside an oxide layer, thereby resulting in reduced non-uniformity of characteristics among variable resistance elements (hereinafter this process for forming the electric path inside the oxide layer just after manufacture is referred to as initial breakdown). The initial breakdown causes the resistance value of the variable resistance element to decrease from $10^5$ to $10^8 \Omega$ (100 k$\Omega$ to 100M$\Omega$) to $10^3$ to $10^4 \Omega$ (1 k$\Omega$ to 10 k$\Omega$). A redox reaction occurring in the conductive path, which results from application of the electric pulse, is a cause of the resistance changing operation. The initial breakdown is an essential process to form such a conductive path for allowing the resistance changing operation to be performed stably. If the variable resistance element performs the resistance changing operation without performing the initial breakdown, non-uniformity of characteristics among variable resistance elements tends to occur. As should be appreciated, the initial breakdown is also favorable so as to lessen non-uniformity of characteristics among variable resistance elements.

In Experimental example 3, consideration was given to how the voltage required for this initial breakdown changed depending on a heating process of the material of the upper electrode.

Figure 16:
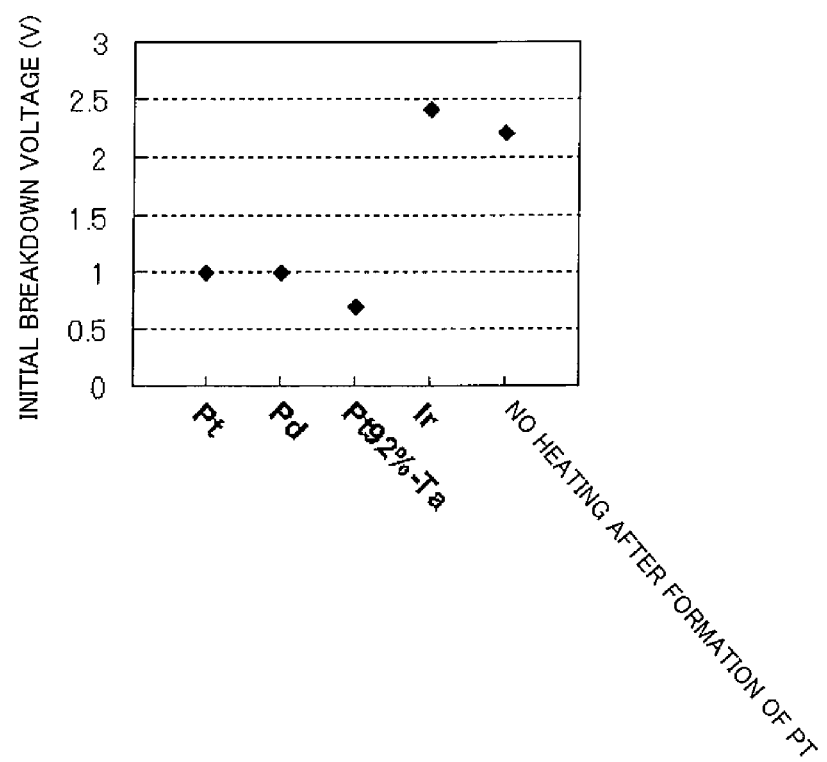
FIG. 16 is a view showing the relation between a material of an upper electrode of a variable resistance element and an initial breakdown voltage in Experimental example 3.

FIG. 16 is a view showing the relation between the material of the upper electrode of the variable resistance element and the initial breakdown voltage in Experimental example 3. The thickness of the upper electrode was set to 40 nm, the thickness of the second oxide layer was set to 5.5 nm, and the element area was set to 0.25 $\mu m^2$. The other configuration, manufacturing method and conditions were similar to those of Example 1. The transition metal oxide M was tantalum like Example 1. A pulse width of the initial breakdown was set to 100 ns.

As shown in FIG. 16, in the case of platinum, palladium, and platinum-tantalum alloy (Pt92%-Ta8%), the absolute value of the voltage required for the initial breakdown was smaller than that in the case of Iridium (Ir). It was presumed that in the examples using platinum, palladium, and platinum-tantalum alloy, respectively, the hillocks were formed, an electric field was generated concentratively in the hillocks and the voltage for the initial breakdown decreased. By selecting as the upper electrode, the material (platinum, palladium, platinum-tantalum alloy) on which the hillocks are formed, the voltage required for the initial breakdown can be decreased. It is presumed that the present invention is effectively applied to a case where palladium or platinum-tantalum alloy is used as an upper electrode material as well as the case where platinum is used as the upper electrode material.

Figure 17A:
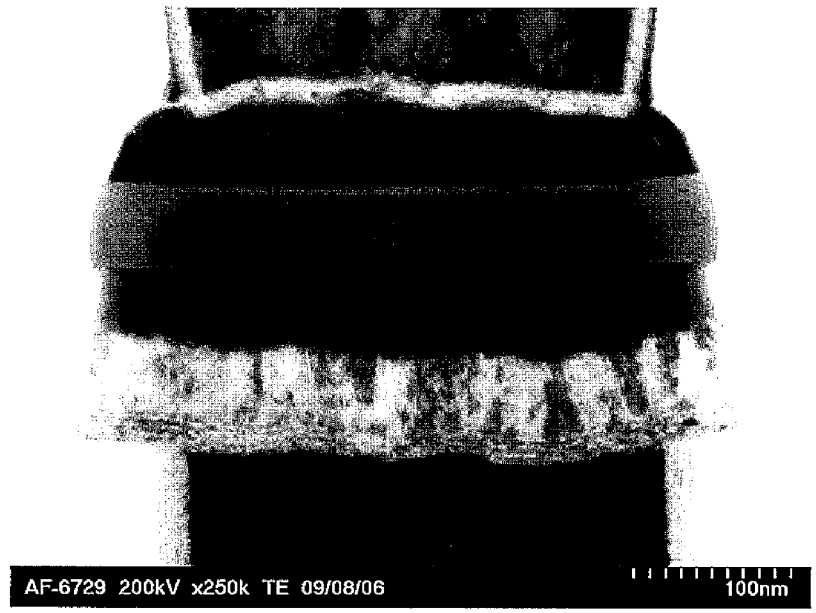
Figure 17B:
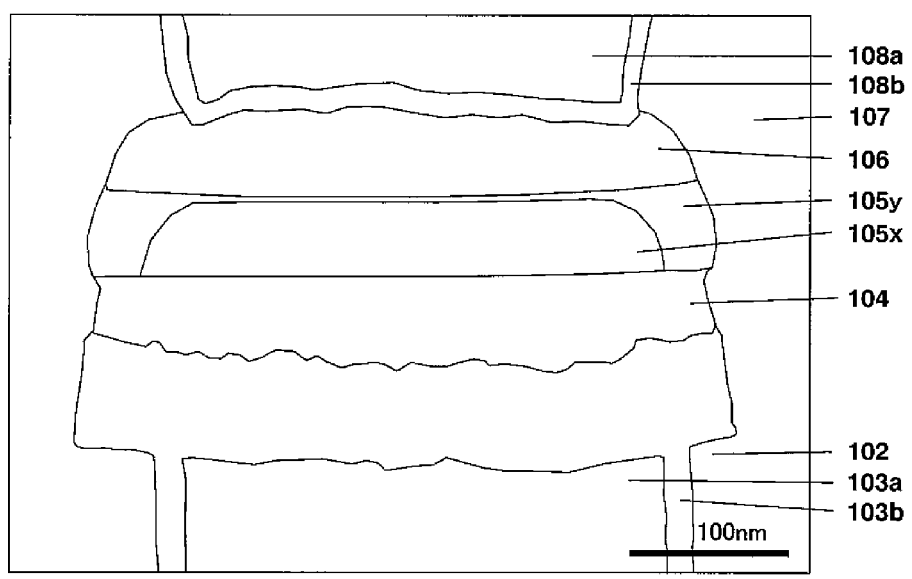

FIGS. 17A and 17B are views showing the cross-section of a variable resistance element according to Experimental example 3 (upper electrode is Ir), in which FIG. 17A is a transmission electron micrograph, and FIG. 17B is a trace diagram of the transmission electron micrograph of FIG. 17A. Reference symbols in FIG. 17B are identical to those of FIG. 11, and description of them will not be given in repetition. As shown in FIGS. 17A and 17B, when Ir was used for the upper electrode, a boundary between the upper electrode 106 and the second oxide layer 105y was very smooth (flat), and no hillocks emerged.

As shown in FIG. 16, when platinum was used for the upper electrode, the absolute value (2.2V) of the voltage required for the initial breakdown was as great as in the case of Iridium, if the heating process step of sintering was omitted (plot at a leftmost side). From this, it was presumed that the heating process was preferably performed to form the hillocks.

In a case where the variable resistance element is used as a memory, it is supposed that, for example, a transistor is used as a switching element. One exemplary configuration is as follows. One of a source and a drain of the transistor is connected in series with the variable resistance element in each memory cell. A gate of the transistor is connected to a word line. By turning ON or OFF the transistor, a particular variable resistance element is selected, and a write operation or a read operation is performed.

One of the source or drain of the transistor which is not connected to the variable resistance element and a terminal of the variable resistance element which is not connected to the transistor, is connected to a bit line, while the other is connected to a source line. In this state, a write voltage or a read voltage is applied to the variable resistance element. Since the transistor and the variable resistance element are electrically connected in series, an applied power supply voltage is divided to be fed to the transistor and to the variable resistance element.

The initial resistance of the variable resistance element changes non-linearly with respect to the applied voltage. With an increase in the applied voltage, the value of the initial resistance decreases. When the voltage of the initial breakdown becomes equal to or greater than 2.0V a difference between the resistance value of the transistor and the resistance value of the variable resistance element decreases, and a divided voltage of a power supply voltage, which is fed to the transistor, increases. Because of this, an adequate voltage is not applied to the variable resistance element, which makes it difficult to perform the initial breakdown. Therefore, the initial breakdown voltage of the variable resistance element is desirably equal to or less than 2.0V.

Because of the presence of the hillocks 106x, the initial breakdown voltage of the variable resistance element can be set to 2.0V or less. Therefore, the variable resistance element is applicable to the memory including the transistor as the switching element.

Numeral modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

A variable resistance element and a manufacturing method thereof according to the present invention are useful as a variable resistance element and a manufacturing method thereof, which can lessen non-uniformity of characteristics among elements.

REFERENCE SIGNS LISTS 10 variable resistance element
20 variable resistance element
100 substrate
101 lower wire
102 first interlayer insulating layer
103 lower contact plug
103a filling layer
103b adhesion layer/barrier layer
104 lower electrode
104' lower electrode material layer
105 oxide layer
105' oxide material layer
105x first oxide layer
105x' first oxide material layer
105y second oxide layer
105y' second oxide material layer
105z' oxide material layer
106 upper electrode
106' upper electrode material layer
106a upper electrode (platinum)
106b alloy of platinum and tungsten
106x hillocks
107 second interlayer insulating layer
108 upper contact plug
108' upper contact hole
108a filling layer
108b adhesion layer/barrier layer
109 upper wire
110 protective layer
110' protective material layer
111 void

The invention claimed is:

1. A method of manufacturing a variable resistance element comprising: wherein M is a transition metal element and O is oxygen;
   forming a lower electrode material layer;
   forming on the lower electrode material layer, a first oxide material layer comprising $MO_x$ wherein a content ratio of O with respect to M is x (x: positive number), and a second oxide material layer comprising $MO_y$ wherein a content ratio of O with respect to M is y (y>x), in this order;
   forming an upper electrode material layer on the second oxide material layer;
   forming a protective material layer on the upper electrode material layer, the protective material layer having a composition different from a composition of the upper electrode material layer;
   patterning the lower electrode material layer, the first oxide material layer, the second oxide material layer, the upper electrode material layer, and the protective material layer in a predetermined shape to form a lower electrode, a first oxide layer, a second oxide layer, an upper electrode, and a protective layer, respectively;
   forming an interlayer insulating layer such that the interlayer insulating layer covers the protective layer;
   forming an upper contact hole such that the upper contact hole penetrates the interlayer insulating layer, the protective layer is exposed on a bottom of the upper contact hole, and the upper electrode is not exposed on the bottom of the upper contact hole;
   forming an upper contact plug inside the upper contact hole; and
   heating the upper electrode to form a plurality of hillocks which protrude into the second oxide layer and do not pierce the second oxide layer, on grain boundaries of a material constituting the upper electrode, and forming a plurality of concave portions in the second oxide layer, respectively, on an interface between the second oxide layer and the upper electrode such that the plurality of concave portions correspond to the hillocks, respectively.

2. The method of manufacturing the variable resistance element according to claim 1, wherein the upper electrode is formed to have a thickness greater than 20 nm.

3. The method of manufacturing the variable resistance element according to claim 2, wherein the upper electrode is formed to have a thickness less than 100 nm.

4. The method of manufacturing the variable resistance element according to claim 1, wherein the upper electrode comprises one of platinum, palladium, alloy containing platinum, and alloy containing palladium.

5. The method of manufacturing the variable resistance element according to claim 1, wherein in the step of forming the plurality of concave portions, the plurality of concave portions are formed in such a manner that an interface between the first oxide layer and the second oxide layer is flat, and an interface between the second oxide layer and the upper electrode has concave and convex portions, to cause the second oxide layer to have the plurality of locally thinned portions.

6. The method of manufacturing the variable resistance element according to claim 1, wherein the transition metal element is tantalum and $2.1 \leq y$ and $0.8 \leq x \leq 1.9$ are satisfied.

7. The method of manufacturing the variable resistance element according to claim 1, wherein the upper electrode is formed to have a thickness greater than 10 nm.

8. The method of manufacturing the variable resistance element according to claim 1, wherein the hillocks are formed not to physically contact the first oxide layer.

9. The method of manufacturing the variable resistance element according to claim 1, wherein the protective layer comprises a nitride of alloy of titanium and aluminum or a nitride of titanium.

10. The method of manufacturing the variable resistance element according to claim 2, wherein the upper electrode comprises one of platinum, palladium, alloy containing platinum, and alloy containing palladium.

11. The method of manufacturing the variable resistance element according to claim 3, wherein the upper electrode comprises one of platinum, palladium, alloy containing platinum, and alloy containing palladium.

* * * * *